(12) United States Patent
Ijuin et al.

(10) Patent No.: US 6,471,115 B1
(45) Date of Patent: Oct. 29, 2002

(54) PROCESS FOR MANUFACTURING ELECTRONIC CIRCUIT DEVICES

(75) Inventors: Masahito Ijuin, Fujisawa; Toru Nishikawa; Ryohei Sato, both of Yokohama; Mitsugu Shirai, Hadano; Yuzo Taniguchi, Kodaira; Kosuke Inoue; Masahide Harada, both of Yokohama; Tetsuya Hayashida, Nishitama-gun, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/585,391

(22) Filed: Jun. 2, 2000

Related U.S. Application Data

(63) Continuation-in-part of application No. 09/160,288, filed on Sep. 25, 1998, now Pat. No. 6,227,436, which is a division of application No. 08/753,018, filed on Nov. 19, 1996, now Pat. No. 5,878,943, which is a continuation-in-part of application No. 08/578,054, filed on Dec. 22, 1995, now Pat. No. 5,816,473, which is a continuation of application No. 08/240,320, filed on May 10, 1994, now abandoned, which is a division of application No. 07/890,255, filed on May 29, 1992, now Pat. No. 5,341,980, which is a continuation-in-part of application No. 07/656,465, filed on Feb. 19, 1991, now abandoned.

(30) Foreign Application Priority Data

| Feb. 19, 1990 | (JP) | 2-036033 |
| Aug. 28, 1991 | (JP) | 3-216953 |
| Dec. 27, 1991 | (JP) | 3-345829 |
| Apr. 22, 1992 | (JP) | 4-102952 |
| Dec. 28, 1993 | (JP) | 5-334603 |
| Dec. 22, 1994 | (JP) | 6-319810 |

(51) Int. Cl.[7] .................... B23K 31/02; B23K 1/20
(52) U.S. Cl. .................. 228/180.22; 228/205; 228/214
(58) Field of Search .................. 228/180.22, 245, 228/246, 203, 205, 206, 214

(56) References Cited

U.S. PATENT DOCUMENTS

| 3,621,564 A | 11/1971 | Tanaka et al. |
| 4,334,646 A | 6/1982 | Campbell |

(List continued on next page.)

FOREIGN PATENT DOCUMENTS

| EP | 0303043 | 2/1989 |
| JP | 56-78356 | 6/1981 |

(List continued on next page.)

OTHER PUBLICATIONS

Patent Abstracts of Japan, vol. 1995, No. 02, Mar. 31, 1995 (06–326449).

(List continued on next page.)

*Primary Examiner*—Tom Dunn
*Assistant Examiner*—Kiley Stoner
(74) *Attorney, Agent, or Firm*—Mattingly, Stanger & Malur, P.C.

(57) ABSTRACT

The present invention is a process for manufacturing an electronic circuit device by applying a solder material to electronic parts or electrodes on a printed circuit board; the process comprising the steps of removing an initial surface oxide film and an organic contaminant film from the surfaces of the solder material and electrode, covering the solder material and an area to which solder is to be applied which is comprised of the electrode, with a liquid vaporizing up after the bonding is completed in the step of heat-melting the solder material, to thereby prevent reoxidation of the joining area surface, and heat-melting the solder material, to carry out solder bonding without using any flux.

4 Claims, 31 Drawing Sheets

U.S. PATENT DOCUMENTS

| | | | |
|---|---|---|---|
| 4,379,218 A | | 4/1983 | Grebe et al. |
| 4,494,688 A | * | 1/1985 | Hatada et al. |
| 4,545,610 A | | 10/1985 | Lakritz et al. |
| 4,632,295 A | | 12/1986 | Brusic et al. |
| 4,732,312 A | | 3/1988 | Kennedy et al. |
| 4,919,729 A | | 4/1990 | Elmgren et al. |
| 4,921,157 A | | 5/1990 | Dishon et al. |
| 5,129,962 A | | 7/1992 | Gutierrez et al. |
| 5,188,280 A | | 2/1993 | Nakao et al. |
| 5,192,582 A | | 3/1993 | Liedke et al. |
| 5,193,738 A | | 3/1993 | Hayes |
| 5,232,674 A | | 8/1993 | Mukai et al. |
| 5,246,880 A | | 9/1993 | Reele et al. |
| 5,272,310 A | | 12/1993 | Daikuzono |
| 5,284,287 A | | 2/1994 | Wilson et al. |
| 5,409,543 A | | 4/1995 | Panitz et al. |
| 5,451,274 A | | 9/1995 | Gupta |
| 5,499,668 A | | 3/1996 | Katayama et al. |
| 5,516,031 A | * | 5/1996 | Nishikawa et al. |
| 5,526,978 A | | 6/1996 | Nagatsuka et al. |
| 5,564,617 A | | 10/1996 | Degani et al. |
| 5,616,164 A | | 4/1997 | Ochiai et al. |
| 5,616,517 A | | 4/1997 | Wen et al. |
| 5,712,192 A | | 1/1998 | Lewis et al. |
| 5,829,125 A | | 11/1998 | Fujimoto et al. |
| 5,865,365 A | | 2/1999 | Nishikawa et al. |
| 5,940,728 A | | 8/1999 | Katayama et al. |
| 5,973,406 A | | 10/1999 | Harada et al. |
| 5,976,302 A | | 11/1999 | Oppermann et al. |

FOREIGN PATENT DOCUMENTS

| | | | |
|---|---|---|---|
| JP | | 58-3238 | 1/1983 |
| JP | | 59-225893 | 12/1984 |
| JP | | 62-256961 | 11/1987 |
| JP | | 63-97382 | 4/1988 |
| JP | | 64-10634 | 1/1989 |
| JP | | 2-25291 | 1/1990 |
| JP | | 2-1522246 | 6/1990 |
| JP | | 2-290693 | 11/1990 |
| JP | 403138941 A | * | 6/1991 |
| JP | | 3-171643 | 7/1991 |
| JP | | 3-241755 | * 10/1991 |
| JP | | 4-220168 | 8/1992 |
| JP | 405235061 A | * | 9/1993 |
| JP | | 6-041601 | 2/1994 |
| JP | | 6-87067 | 3/1994 |
| JP | | 6-291457 | 10/1994 |
| JP | | 7-99382 | 4/1995 |
| JP | | 8-108292 | 4/1996 |
| JP | | 8-162753 | 6/1996 |
| JP | 408222846 A | * | 8/1996 |
| JP | | 8-293665 | 11/1996 |
| JP | 410321671 A | * | 12/1998 |
| WO | | WO9732457 | 4/1997 |

OTHER PUBLICATIONS

Patent Abstracts of Japan, vol. 017, No. 418 (E–1408), Aug. 4, 1993 (05–082954).

Patent Abstracts of Japan, vol. 013, No. 560, Dec. 13, 1989 (01–233090).

Patent Abstracts of Japan, vol. 015, No. 367 (E–1112), Sep. 17, 1991 (03–145192).

Patent Abstracts of Japan, vol. 013, No. 378 (E–809), Aug. 22, 1989 (01–128590).

Harper et al, "Ion Beam Joining Technique", J. Vacuum Science Technology, 20(3), Mar. 1982, pp. 359–363.

J. Fujino et al, "Development of Ball Bumps Making Method with Screen Printing", 1st Symposium of Microjoining and Assembly Technology in Electronics, Feb. 9–10, 1995, pp. 187–192.

* cited by examiner

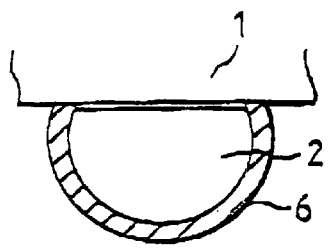
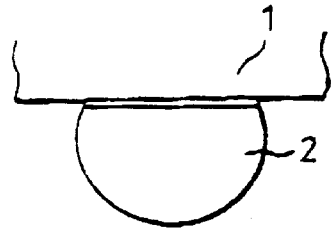
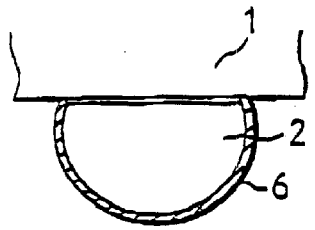
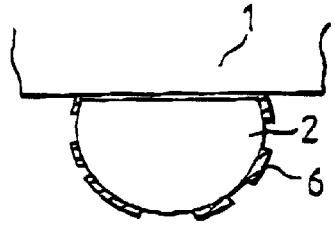
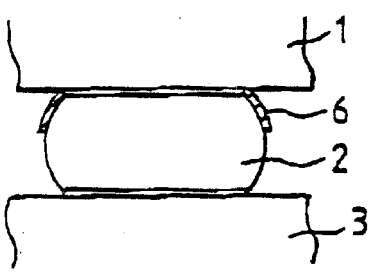
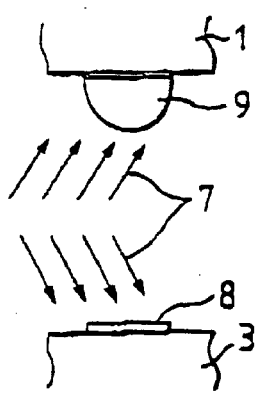
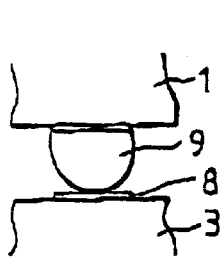
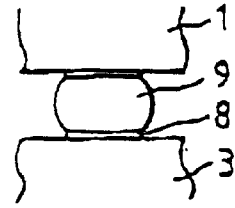
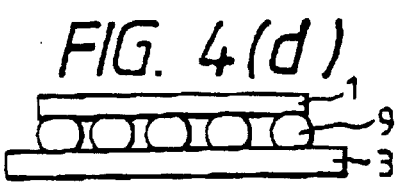

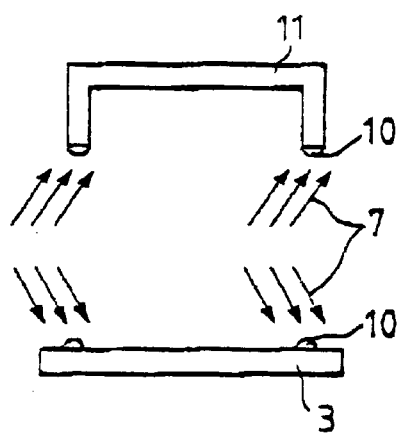
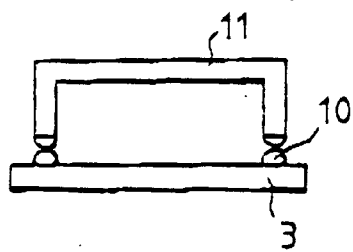
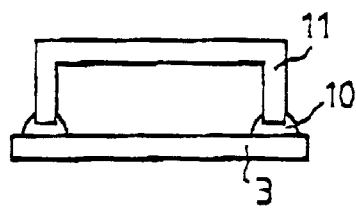
FIG. 5(a)  FIG. 5(b)  FIG. 5(c)
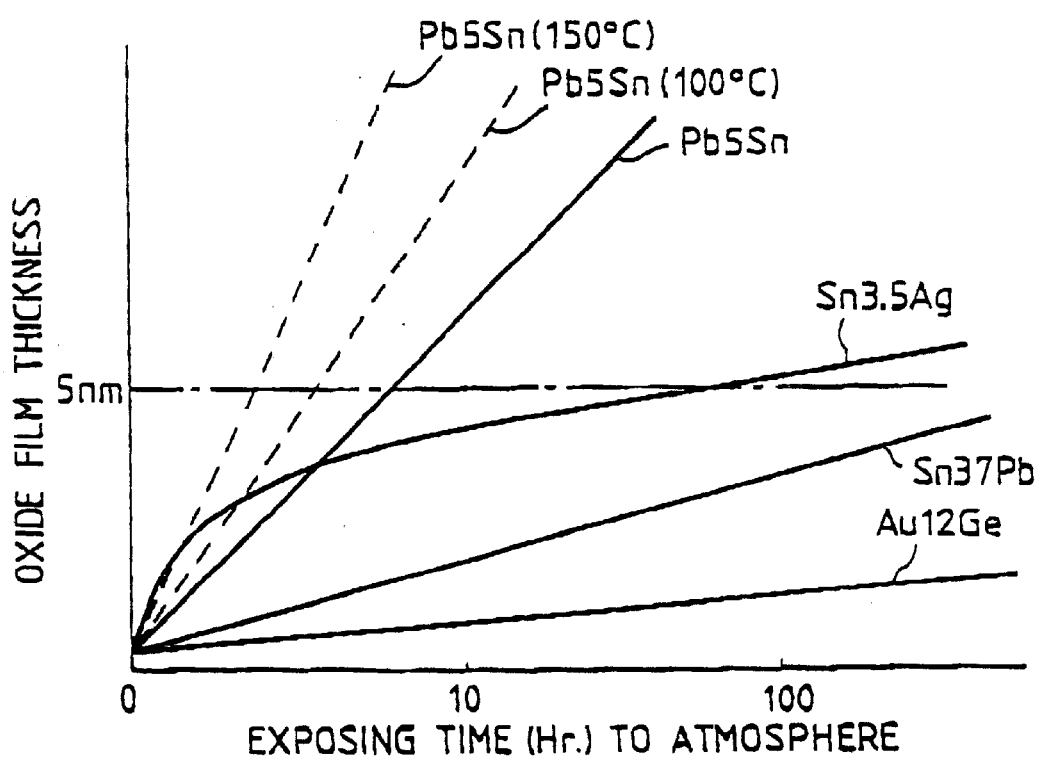
FIG. 6

(1) SPUTTER CLEANING (2) ALIGNING (3) REFLOW (4) SPUTTER CLEANING (5) ALIGNING (6) REFLOW

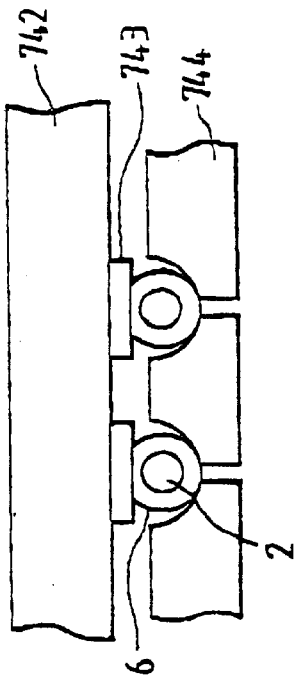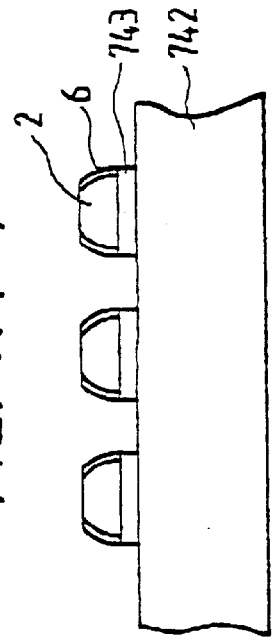
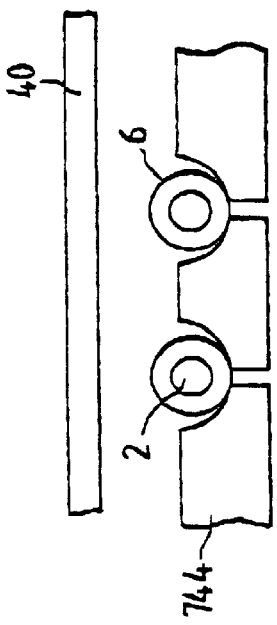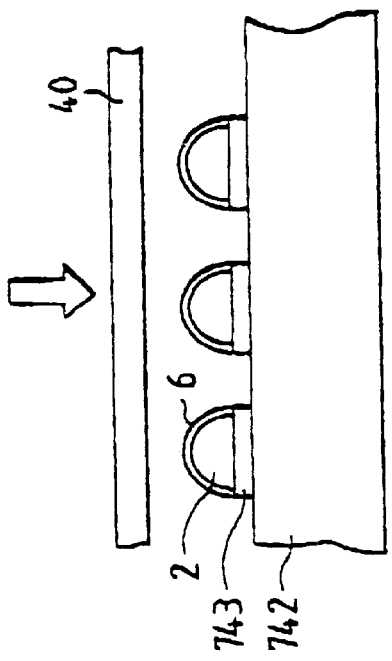

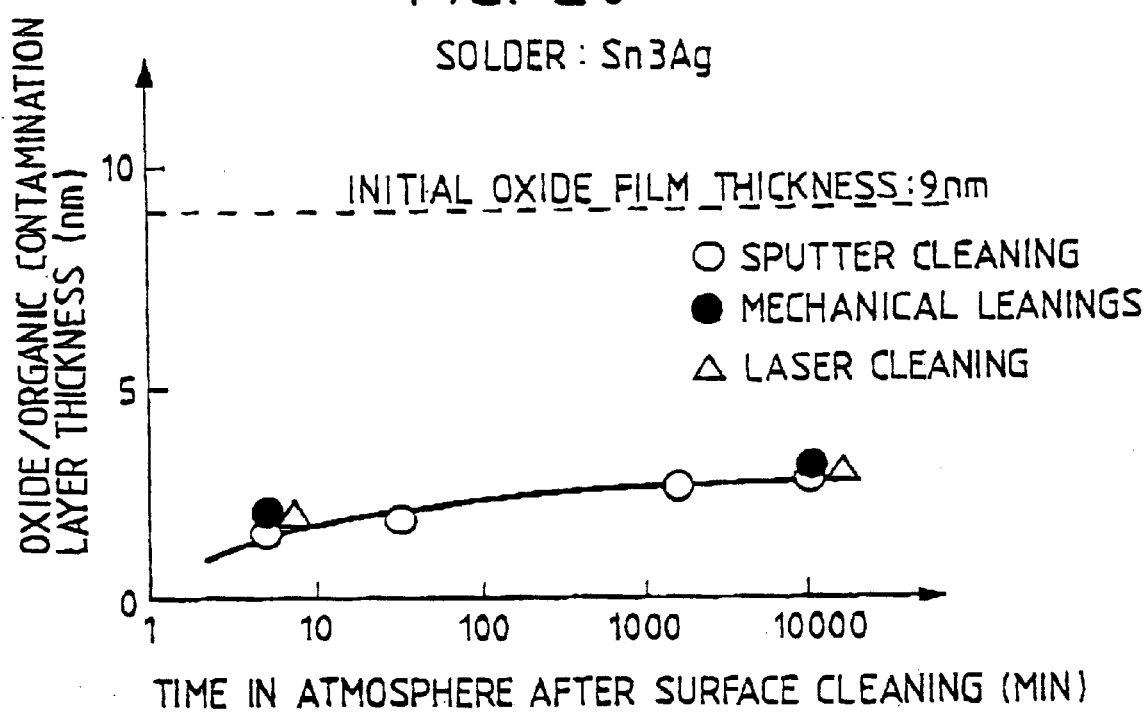

FIG.41

| TYPE | LIQUID | | | LIQUID REMAINING AFTER REFLOWING | BONDING EVALUATION | | |
|---|---|---|---|---|---|---|---|
| | LIQUID NAME | CHEMICAL FORMULA | BOILING POINT | | WETTABILITY | SELF-ALIGNMENT | RESIDUE |
| ALCOHOLS | 2-PHENOXYETHYL ALCOHOL | $C_6H_5OCH_2CH_2OH$ | 510k | PRESENT | ○ | ○ | ○ |
| | TRIETHYLENE GLYCOL | $H(OCH_2CH_2)_3OH$ | 558k | PRESENT | ○ | ○ | ○ |
| | PENTAETHYLENE GLYCOL | $H(OCH_2CH_2)_5OH$ | 643k | PRESENT | ○ | ○ | ○ |
| | HEXAETHYLENE GLYCOL | $H(OCH_2CH_2)_6OH$ | 673k | PRESENT | ○ | ○ | ○ |
| HYDRO-CARBONS | n-TRIDECANE | $CH_3(CH_2)_{11}CH_3$ | 507k | NONE | ○ | × | ○ |
| | n-HEXADECANE | $CH_3(CH_2)_{14}CH_3$ | 560k | PRESENT | △ | × | × |
| ESTERS | ETHYL SALICYLATE | $HOC_6H_4COOC_2H_5$ | 507k | PRESENT | ○ | △ | ○ |
| KETONES | 2-UNDECANONE | $CH_3(CH_2)_8COCH_3$ | 504k | PRESENT | × | × | × |
| ALDEHYDE | CINNAMALDEHYDE | $C_6H_5CHCHCHO$ | 523k | PRESENT | △ | × | × |
| ETHERS | METHYL BENZYL ETHER | $C_6H_5CH_2OCH_3$ | 559k | NONE | × | × | × |

○ GOOD  △ SLIGHTLY POOR  × POOR

ANALYTICAL RESULTS OF RESIDUES (FT-IR)

FIG.43

| EVALUATED LIQUID | | | BONDING EVALUATION | | |
|---|---|---|---|---|---|
| TYPE OF LIQUID | EXPECTED EFFECT | | WETTA-BILITY | SELF-ALIGN-MENT | RESI-DUE |
| | OXIDATION PREVENTION | REDUCING ACTION | | | |
| ALCOHOLS (-OH GROUP) | YES | YES | ○ | ○ | ○ |
| ALDEHYDES (-CHO) | YES | YES | △ | ✕ | ✕ |
| HYDROCARBONS | YES | NO | △ | ✕ | ✕ |
| ESTERS (R-COO-R²) | YES | NO | ○ | △ | ○ |
| KETONES (C=O) | YES | NO | ✕ | ✕ | ✕ |

PROCESS FOR MANUFACTURING ELECTRONIC CIRCUIT DEVICES

CROSS REFERENCE TO RELATED APPLICATION

This application is a continuation-in-part of U.S. patent application Ser. No. 09/160,288, filed on Sep. 25, 1998, now U.S. Pat. No. 6,227,436, which is a divisional application of U.S. patent application Ser. No. 08/753,018, filed on Nov. 19, 1996, now U.S. Pat. No. 5,878,943, which is a continuation-in-part of U.S. patent application Ser. No. 08/578,054, filed on Dec. 22, 1995, now U.S. Pat. No. 5,816,473, which is a continuation application of U.S. patent application Ser. No. 08/240,320, filed on May 10, 1994, now abandoned, which is a divisional application of U.S. patent application Ser. No. 07/890,255, filed on May 29, 1992, now U.S. Pat. No. 5,341,980, which is a continuation-in-part of U.S. patent application Ser. No. 07/656,465, filed on Feb. 19, 1991, now abandoned, the entire disclosure of which is hereby incorporated by reference. A disclosure of U.S. Pat. No. 09/125,970 filed on Apr. 26, 1999, now abandoned, is hereby incorporated by reference.

BACKGROUND OF THE INVENTION

1. Field of the Invention

This invention relates to a process for manufacturing an electronic circuit device by which solder can be applied to electrodes of electronic parts or circuit boards without using any flux. It also relates to a process for manufacturing an electronic circuit device by which electronic parts having solder balls can be bonded to circuit boards.

2. Description of the Related Art

With regard to the joining of electronic circuit devices, a mounting method making use of flip-chips and a bonding method such as BGA (ball grid array) making use of solder bumps attract notice as electronic instruments and electronic parts are made to have a smaller size, a higher density and a higher performance. Such methods are energetically developed. The bonding method making use of solder bumps is characteristic of an excellent electrical performance exhibited because of wiring length that can be made shorter than that of leads or the like and also an ease of mounting because of bumps arranged in grids so that terminal pitches can be made smaller than QFPs.

In this bonding method, solder bumps must be previously applied to electrodes provided on the side of the board or substrate and must be surely applied to the intended electrodes without any defects such as uneven solder quantity and bridges.

Bumps are applied by, e.g., (1) a method in which solder films are formed by plating or vacuum evaporation, (2) a method in which a solder paste is printed and (3) a method in which solder balls are laid out.

In the method (1), solder films are formed at bonding areas by plating or vacuum evaporation, and a flux is coated thereon, which is thereafter heat-melted to provide bumps.

In the method (2), as reported in, e.g., 1st Symposium "Microjoining and Assembly Technology in Electronics '95", Draft Collection, pp. 187–192, a solder paste used in conventional surface packaging is printed on electrodes, followed by heat-melting.

In the method (3), as disclosed in, e.g., U.S. Pat. No. 5,284,287, solder balls are laid out on an aligning jig, namely, a positioning plate having recess (i.e. holes or concaves) formed correspondingly to the electrodes, and are aligned with the electrodes, followed by heat-melting to provide bumps.

When two different materials or members are to be soldered together, a flux or a cream containing flux has been used to remove oxide films formed on the soldered surfaces, to maintain these surfaces clean by preventing oxidization thereof and to promote the wettability of solder on these surfaces. However, when such a flux or flux-containing cream has been used, there has been a tendency for voids to be generated due to the evaporation of the flux during a soldering operation, as illustrated in FIG. 1(c), which results in a lowering of strength and hence reliability of the soldered junction.

In above three types of methods for providing solder bumps, the method (1), in which solder films are formed by plating or vacuum evaporation, has problems that it requires equipment cost for the plating or vacuum evaporation compared with other methods and also makes it difficult to control layer thickness and composition to form uniform solder bumps. The method (2), in which a solder paste is printed, has a problem that when the solder paste is not completely transferred when printed, it remains on a metal mask to make uneven or insufficient the quantity of the solder applied. To solve such a problem of insufficient transfer, a method is proposed in which the printed solder paste is heat-melted while keeping the mask brought into close contact with the substrate, which, however, has a problem that the solder is not transferred if the substrate warps when heated. The method (3), in which solder balls are laid out an aligning jig having holes or concaves formed correspondingly to the electrodes and are mounted on the electrodes followed by heat-melting, can achieve less unevenness in the quantity of solder to be applied than the methods (1) and (2), and hence can achieve less unevenness in the height of bumps.

However, any of the above methods make use of the flux. Accordingly, they require a cleaning step because flux residues are left after the heat-melting. Hitherto, the flux residues have been removed by cleaning with organic solvents such as chlorofluorocarbons and trichloroethane, having an excellent cleanability. These cleaning agents, however, have caused an environmental problem of the ozone-shield destruction. The voids that are produced when the flux is taken into bonding areas have also come into question. In particular, since spherical bodies, like the solder bumps, are arranged in grids, it is difficult to carry out cleaning compared with solder bonding of conventional chip elements and QFPs, so that the flux residues cannot be completely removed to bring about a possibility of causing corrosion and migration.

In the method (2), if the solder is not completely transferred and remains on the metal mask, the surface must be cleaned every time the solder paste is printed. In the method (3), too, if the flux adheres to the aligning jig at the time of mounting, there is a problem that the solder balls are not transferred at the time of next mounting because of a tackiness of the flux. Thus, like the method (2), in which the solder is applied using solder paste, the aligning jig must also be cleaned, and this is a problem in respect of work efficiency and productivity.

In an effort to solve this problem, a low-residual, low-activity flux requiring no post-soldering washing operation has been proposed. However, since such a low-activity flux is easily oxidized when heated in the atmosphere, the soldering operation must be performed in a belt furnace filled with $N_2$. Such a furnace is partitioned by shutters into an inlet gas purge chamber, a heating, melting, and bonding chamber in which air is replaced by $N_2$ sufficiently to maintain the oxygen concentration in this second chamber as low as about 70 ppm, and an outlet gas purge chamber.

Although this bonding method is easy to use, it requires the $N_2$-filled belt furnace. Therefore, fluxless soldering using an ion beam has been proposed in J. Vacuum Science Technology, 20(3), March 1982, pages 359–363. In soldering without flux, the oxide film must be prevented from growing on a solder surface after the surface has been cleaned by sputtering. To this end, the members to be soldered and the soldering material are aligned, and the soldering material is heated in a nonoxidizing atmosphere, which is, unfortunately, impractical in view of the facility needed to perform the operation. More particularly, a large, complicated facility is required, which inevitably results in technical difficulties in the alignment of the members.

Another fluxless soldering method has been proposed in Japanese Kokai (P) 58-3238, which describes the juxtaposition of two members to be bonded in a vacuum chamber, wherein the solder surfaces are cleaned by ion irradiation, aligned by overlapping, and then irradiated again with an ion beam to melt the solder. Since the cleaning, aligning, and heating operations are all performed within the vacuum chamber, workability and productivity are very low. More particularly, the method requires an alignment device that picks up at least one of the two members to be bonded, turns it over, carries it to the other member, and aligns a number of bonding portions on the two members. This operation requires a large-sized vacuum chamber, which increases the cost of the entire apparatus while decreasing its efficiency. Moreover, the possibility of contamination of the vacuum chamber is very high, and there is a limit to the thermal capacity of the apparatus due to the use of an ion beam, causing the simultaneous heating of large substrates to be difficult.

Another example is disclosed in Japanese Kokai (P) 3-171643. In this method, an atom or ion beam irradiation device and a post-processing device for aligning bonding portions and heating solder are separately provided. The interior of the post-processing device is filled with an inert gas. Members to be bonded together are aligned in a plenum chamber of the post-processing device and heated to a temperature below the melting point of the solder, under pressure, to temporarily fix the members, which are then transported to a heating/melting chamber of the post-processing device for the soldering to be performed.

Although no aligning device is required according to this method, the post-processing device must be kept at vacuum pressure, and the alignment and soldering performed in the post-processing device.

In spite of the problems of the prior art, the proliferation and advancement of computers and other apparatus that require electronic circuit devices employing flip-chip connections (wherein a number of fine connections are made using fine solder balls) requires a similar advancement in the precision of such connections. However, it has been very difficult to bond a number of parts using flip-chip connections within an inert atmosphere in a vacuum chamber with high precision. Furthermore, the transportation of such parts into, out of, and within the vacuum chamber, together with the evacuation of the vacuum chamber, etc., have proven troublesome, causing the workability of the prior art systems to be low.

SUMMARY OF THE INVENTION

Accordingly, a first object of the present invention is to provide a process for manufacturing an electronic circuit device by which solder can be applied at a low cost by fluxless bonding that enables easy and simple application of uniform solder and requires no cleaning step.

The above first object can be achieved by a process for manufacturing an electronic circuit device by applying a solder material to an electrode the electronic circuit device has; the process comprising the steps of;

removing an initial surface oxide film and/or an organic contaminant film from the surface(s) of the solder material and/or electrode;

covering the solder material and/or the electrode with a liquid; and heat-melting the solder material;

to carry out solder bonding without using any flux.

The object can also be achieved by a process for manufacturing an electronic circuit device by applying a solder material to an electrode the electronic circuit device has; the process comprising the steps of;

printing or coating on the electrode a paste comprising a mixture of a liquid and a solder powder; the liquid having a reducing action to remove an initial surface oxide film and/or an organic contaminant film from the surface(s) of the solder material and/or electrode; and heat-melting the paste;

to carry out solder bonding without using any flux.

The object can still also be achieved by a process comprising the steps of;

mounting a solder material on an electrode with registration; the solder material being a material on which an initial surface oxide film has been thinly formed, and the electrode being an electrode on the surface of which an oxidation preventive film has been formed;

covering the solder material and/or the electrode with a liquid; and heat-melting the solder material; to carry out solder bonding without using any flux.

The object can still also be achieved by;

mounting an anisotropic conductive film on an electrode with registration; the film being a film on which solder has been formed correspondingly to an electrode to which the solder is to be applied, and the electrode being coated with a liquid; and heat-melting the solder material.

Meanwhile, after the initial oxide films are physically removed and the solder balls are laid out on the jig and mounted on the electrodes, the solder balls may be heat-melted in a non-oxidizing atmosphere. This enables prevention of the reoxidation and makes it unnecessary to carry out not only the cleaning but also the coating of the liquid. The problems previously discussed may occur also when electronic parts having solder balls are bonded to circuit boards.

Accordingly, a second object of the present invention is to provide a process for manufacturing an electronic circuit device by bonding electronic parts to circuit boards in a high reliability by fluxless bonding.

The above second object can be achieved by a process for manufacturing an electronic circuit device by bonding an electronic part having solder balls to a circuit board; the process comprising the steps of;

removing an initial surface oxide film and/or an organic contaminant film from the solder material and/or the circuit board at its area to which solder is to be applied;

covering with a liquid the solder material and/or the circuit board at its area to which solder is to be applied; and heat-melting the solder material; to carry out solder bonding without using any flux.

The object can also be achieved by a process comprising the steps of;

mounting a solder material with registration, on a circuit board at its area to which solder is to be applied; the solder material being a material an electronic part has and on which an initial surface oxide film has been thinly formed, and the area to which solder is to be applied being an area on the surface of which an oxidation preventive film has been formed;

covering with a liquid: the solder material and/or the area to which solder is to be applied; and heat-melting the solder material; to carry out solder bonding without using any flux.

BRIEF DESCRIPTION OF THE DRAWINGS

FIGS. 3(a)–3(e) are cross-sections showing a fluxless soldering procedure performed after the solder surface is sputter-cleaned, according to a principle of the present invention;

FIGS. 4(a)–4(d) are cross-sections illustrating the soldering of a semiconductor integrated circuit onto a ceramic substrate, according to an embodiment of the present invention;

FIGS. 5(a)–5(c) are cross-sections showing the soldering of a sealing cap onto a ceramic substrate, according to an embodiment of the present invention;

FIG. 6 is a graph showing a relationship between time of exposure to an oxidizing atmosphere and oxide film thickness for various soldering materials, after sputter-cleaning;

FIGS. 16(a) and 16(b) illustrate steps for removing an oxide film from a solder ball mechanically, and for soldering the solder ball onto a substrate, according to the present invention;

FIGS. 17(a) and 17(b) illustrate a mechanical removal of an oxide film from a solder ball on a substrate, according to f the present invention;

FIG. 20 illustrates the relationship between the thickness of an oxide film on a solder ball and time of formation in an atmospheric environment;

FIG. 41 is a table showing the evaluation results of bonding performance attributable to various liquids.

FIG. 43 is a table showing the evaluation results of bonding performance attributable to various liquids.

DETAILED DESCRIPTION OF THE INVENTION

In the present invention, the liquid may preferably be a liquid capable of vaporizing up after the bonding is completed in the heat-melting step, because the solder material can thereby be well wetly spread.

The liquid may also preferably be a liquid having a reducing action, because the oxide films and organic contaminant films can thereby be removed from the electrode and solder material surfaces.

The liquid may also preferably be a liquid having a surface tension or viscosity high enough for the solder material to be provisionally fastened to the electrode.

A resist may preferably be formed in a thickness which is large at the area surrounding the electrode, because the solder material can thereby be prevented from coming off the surface of the electrode after the solder material is mounted thereon and until the bonding is completed in the heat-melting step.

For example, in the present invention, solder balls are laid out on an aligning jig having holes or concaves formed correspondingly to the electrodes to which the solder is to be applied, and thereafter are mounted on the electrodes with registration after a liquid is coated on the surfaces of electrodes or on the surfaces of solder balls laid out; the liquid being capable of vaporizing up after the bonding is completed in the heat-melting step. As the result, like the instance where the flux is used, this liquid isolates the solder balls and electrodes from the surrounding environment at the time of heating. Hence, even in a surrounding environment of a high oxygen concentration as in the atmosphere, the solder material and electrode surfaces can be prevented from being re-oxidized. Thus, the solder is wetly spread over the electrode surfaces at the time of solder melting, and the solder is applied onto the electrodes. Moreover, when the liquid having a reducing action is used as the above liquid, the initial oxide films can be removed from the electrode surfaces, so that the solder can be readily applied to the electrode surfaces. Also, since this liquid is vaporized off at the time of heat-melting, any residues as in the case of the flux by no means remain to make it unnecessary to clean the joint areas and jig after the solder has been applied. Incidentally, in order to prevent the initial surface oxide films and organic contaminant films, the electrode surfaces may be protected with films of solder, Sn, Au, Ni or Pd. This enables the solder to be more surely supplied. The initial oxide films on the solder material and electrode surfaces may also be removed by physical means such as sputter etching or plasma etching, mechanical means such as polishing, or chemical means such as pickling, and thereafter the solder material may be heat-melted in the presence of the above liquid. Thus, the solder can be applied likewise even when thicker oxide films are formed on the solder material and electrode surfaces.

Figure 1A:
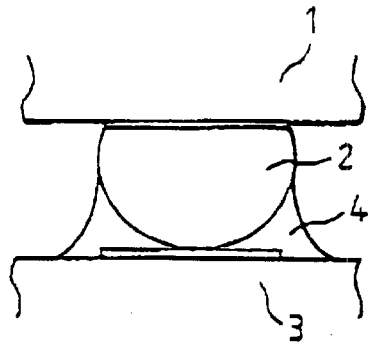
FIGS. 1(a)–1(c) are cross-sections showing a conventional soldering procedure.
Figure 1B:
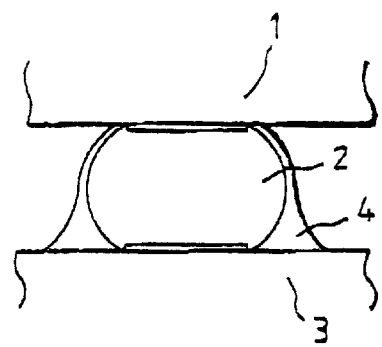
Figure 1C:
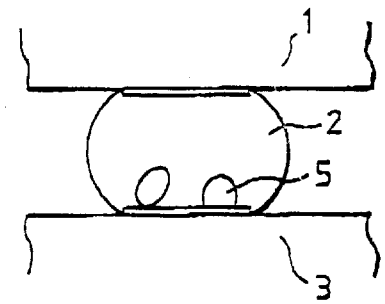
Figure 2A:
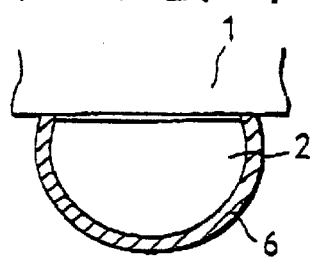
FIGS. 2(a)–2(c) are cross-sections showing a procedure for soldering without flux, wherein the surface of the soldering material is not sputter-cleaned.
Figure 2B:
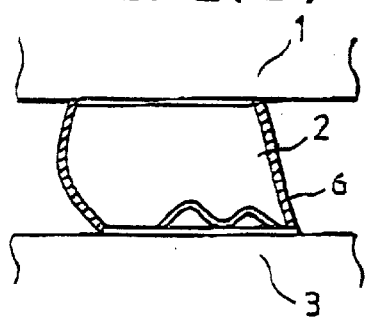
Figure 2C:
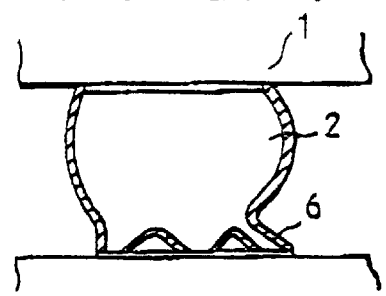

On each solder ball 2 formed on an integrated circuit 1 to be soldered using a flip-chip connection according to the prior art, a thick oxide film or organic/contamination layer 6 forms on the surface of the soldering material as shown in FIG. 2(a). If the soldering material is heated in a nonoxidizing atmosphere such as $H_2/N_2$ or $N_2$ to form the solder connection without sputter cleaning of the oxide film, the wettability of the soldering material, formation of a spherical configuration of the soldering material, and self-alignment of the soldering material due to surface tension are insufficient, as shown in FIG. 2(b) (where reference numeral 3 indicates a second device to be soldered to the integrated circuit 1) and FIG. 2(c).

Therefore, an object of the present invention is to join two such members by soldering without using flux, and while avoiding the problems of the prior art discussed above.

Another object of the present invention is to perform fluxless soldering in which the alignment of the members can be performed in an atmospheric, oxidizing environment.

Another object of the present invention is to produce a solder ball that is suitable for fluxless soldering.

A further object of the present invention is to provide an alignment mark for facilitating alignment of bonding portions of two members, which is effective in fluxless soldering.

In order to achieve these objects, according to the present invention, contaminated and/or oxidized surfaces of a member or members to be soldered and of the soldering material are sputter-cleaned with atoms or ions and, after alignment of the members is performed in an oxidizing atmosphere, the soldering operation is performed in a nonoxidizing atmosphere. Alternatively, the surfaces may be cleaned mechanically, such as by polishing, cutting, laser cleaning, heat cleaning, etc.

Furthermore, contaminated and/or oxidized surfaces of the member or members to be soldered are removed and, after the members have been aligned with each other in an oxidizing atmosphere, the soldering operation is performed in a nonoxidizing atmosphere.

The soldering material may be composed of any constituent elements, provided that the soldering material is capable of joining metals together. For example, any one of an Sn—Pb alloy, an Sn—Ag alloy, an Sn—In alloy, an Sn—Bi alloy, an Au—Sn alloy, an Au—Ge alloy, or a mixture of these alloys, is considered suitable.

The contaminated and/or oxidized surfaces may be removed by any suitable method. For example, a sputter-cleaning method using atoms or ions, a mechanical cleaning method, such as polishing or cutting, a laser cleaning method, or an organic material heat-cleaning method may be employed. It is not suggested that these methods are all equivalent to one another.

A fluxless soldering apparatus constructed according to the teachings of the present invention includes means for removing an oxidized solder film, means for aligning bonding portions of connecting members in an oxidizing atmosphere, and heating means for heating the bonding portions to be soldered in a nonoxidizing atmosphere or a reducing atmosphere. Further, the apparatus comprises evacuation means for evacuating the interior of the heating means, means provided in the heating means for supplying a nonoxidizing gas such as $N_2$, Ar, or Ag, or any mixture thereof, or a reducing gas such as a mixture of $H_2$ and $N_2$, into the interior of the heating means, and control means for controlling the concentration of the gas.

The heating means is partitioned into a plenum chamber, a heating and soldering chamber having a belt furnace for heating solder of the connecting members, and a cooling chamber for cooling the soldered members, each chamber including a vacuum system and a gas supply system, through which a belt conveyor passes. The apparatus has gate valves between atmosphere and the plenum chamber, between adjacent chambers, and between the cooling chamber and atmosphere, to permit communication therebetween.

The plenum chamber is evacuated with or without heating to remove water or gas components adsorbed in the members to be connected, to prevent the concentration of required gas in the heating and soldering chamber from being lowered.

Further, a sputter-cleaning device is provided for removing oxide films and or contaminated surfaces of the bonding portions of the electronic circuit and/or solder by means of an atom or ion beam. Alternatively, a mechanical device may be used for removal of the oxide films or contaminated surfaces of the solder and/or the connecting members.

In another embodiment, a laser beam projecting device may be used for removing the oxide films or contaminated surfaces. In fact, a device of any type may be used for removing the oxide films or contaminated surfaces, provided that the device is capable of removing the oxide films or contaminated surfaces suitably, in keeping with the environmental and other objectives of the present invention.

As mentioned above, the apparatus may also be provided with a means for supplying an organic material of the type and effect described above.

Although unnecessary to the practice of the basic invention, the solder balls may be gold-plated. The gold-plating may be performed after reducing the surfaces thereof with a diluted acid solution. In this case, the oxide film-removing step may be omitted.

The alignment of the members is performed in an atmospheric environment by using alignment mark means which comprises a protrusion formed on each bonding portion of one of the two members, and a recess formed in a protrusion formed on a corresponding bonding portion of the other member, to receive the protrusion of the first member. At least a portion of each protrusion is formed of a solder ball melt-bonded thereto, or of a refractive resin material.

As described above in detail, the present invention can attain a process for manufacturing an electronic circuit device by which the solder can be applied without using any flux, which requires the cleaning step in order to remove its residues or because of its adhesion to assembling jigs. It can also attain a process for manufacturing an electronic circuit device by which electronic parts having solder balls can be bonded to circuit boards without using any flux, which requires the cleaning step in order to remove its residues or because of its adhesion to assembling jigs. Also, when the liquid having a reducing action is used as the liquid capable of vaporizing in the heat-melting step, the solder can be applied in a quantity necessary for soldering, without requiring any step of removing surface oxide films. Hence, a process for manufacturing an electronic circuit device can be attained which has enabled fluxless soldering that promises superior operability and mass productivity and a low cost.

Needless to say, the manner of applying solder balls is not limited to that in the Examples so long as the fluxless bonding is carried out using the above liquid. In other words, the fluxless bonding making use of the liquid of the present invention can be used in all objects to be bonded with solder.

PREFERRED EMBODIMENTS

Preferred embodiments of the present invention will now be described with reference to FIGS. 3–5.

The invention solves the problem of film formation (thick oxide, contamination, etc.) as shown in FIGS. 3(a)–3(e). As shown in FIG. 3(a), for an electronic circuit device 1 (the invention is not limited to a particular device) on which a solder bump, for example, has been provided, a surface of the soldering material 2 on which a thick oxide film 6 is formed is sputter-cleaned to remove the oxide film 6 as shown in FIG. 3(b). After the sputter-cleaning, another oxide film 6 may be formed as shown in FIG. 3(c), but which may be thin compared with the oxide film removed by the sputter-cleaning. By then heating the soldering material 2 in a nonoxidizing atmosphere, the soldering material is expanded to segment the thin film 6, thereby exposing clean surface portions as shown in FIG. 3(d). In this state, soldering is performed without flux, resulting in the state shown in FIG. 3(e) in which the soldering material wets on a surface of a member 3 (which may be metallized) to be soldered, resulting in a desirable junction.

The initial thick oxide film or contamination 6 on the surfaces of the members to be soldered and on the soldering material can be removed by sputter-cleaning with atoms or ions. Further, by thereafter heating and melting the soldering material in a nonoxidizing atmosphere, reoxidation of the solder surface can be prevented, thereby maintaining the solder surface clean for high wettability. The time during which the fluxless soldering can be performed before adverse reoxidation or recontamination of the soldering material surface is based upon the time dependency of the thickness of the reformed film.

On the other hand, alignment of the members to be joined can be performed in an oxidizing atmosphere, which simplifies the aligning operation.

FIGS. 4(a)–4(d) illustrate a first embodiment of the present invention as applied to the soldering of a ceramic substrate 3 to a semiconductor integrated circuit 1. In a particular example, a semiconductor integrated circuit 1 was soldered, using $Pb_5Sn$, for ex-ample, to a metallization pad 8, which was formed on the ceramic substrate 3 by baking molybdenum or tungsten on the ceramic substrate 3, followed by plating with nickel and gold, for example.

As shown in FIG. 4(a), the solder 9 and each metallization pad 8 were sputter-cleaned with argon atoms 7 to remove any oxide film or organic contamination layer thereon. Then, after a positional alignment was performed (FIG. 4(b)) in an oxidizing atmosphere for a time T (in this case, 30 minutes), the ceramic substrate 3 and semiconductor integrated circuit 1 were heated in a $H_2/N_2$ furnace ($H_2:N_2$=1:1 or 1:3) until the soldering material 9 was melted. FIG. 4(c) illustrates that a good solder junction was obtained without using flux. Finally, FIG. 4(d) illustrates the completed configuration.

An experiment was conducted to determine the maximum time T during which the members to be soldered and the soldering material can be handled in an oxidizing atmosphere (e.g., during alignment) without a detrimental effect on the resultant soldering, by performing the procedure described above for alignment times T between one hour and eight hours, with one-hour increments. The results of the experiment show that a good solder junction was obtained for T≦L five hours, while T=eight hours resulted in a nonspherical soldering material shape (although a good solder junction was also obtained). Therefore, it is considered that T=eight hours is the working upper limit for acceptable soldering.

Figure 7:
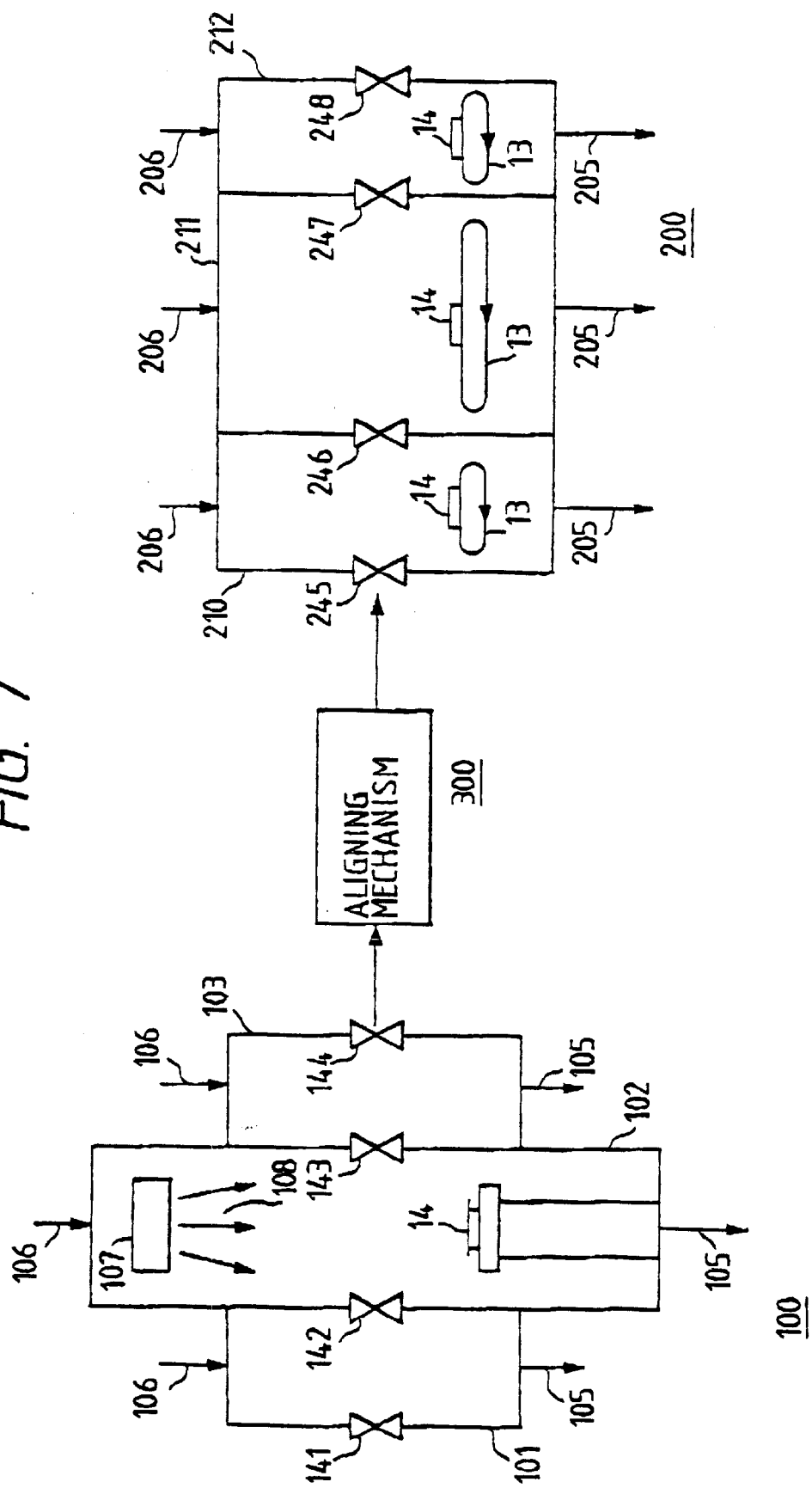
FIG. 7 is a block diagram showing a soldering apparatus constructed according to the teachings of an embodiment of the present invention.

The process of FIGS. 4(a)–4(d) may be carried out using the apparatus shown in FIG. 7. This apparatus will be discussed in greater detail below.

FIGS. 5(a)–5(c) show another example according to the present invention, wherein a cap 11 of AlN was soldered to a ceramic substrate 3 with a Sn37Pb solder 10 to form a sealed structure. As shown in FIG. 5(a), the solder bumps 10 on both the cap 11 and the ceramic substrate 3 were sputter-cleaned with argon atoms 7 to remove oxide films or contamination layers thereon. Then, following an alignment procedure performed in 30 minutes in an oxidizing atmosphere, the cap 11 and ceramic substrate 3 were put in a $H_2/N_2$ furnace so that the solder 10 was melted and the cap and substrate joined without using flux (the soldering material was also applied to the respective members without using flux). See FIGS. 5(b) and 5(c). A favorable junction was obtained.

A similar experiment to that described above was conducted to determine the maximum time T for which the members to be soldered and the soldering material could be handled in an oxidizing atmosphere, during alignment, without a detrimental effect on the resultant soldering. The results of the experiment showed that a good solder junction was obtained for a time T≦five hours, while T=eight hours resulted in a nonspherical, though acceptable, solder junction. Therefore, it is considered that T=eight hours is a suitable upper limit for this embodiment.

Other Pb and Sn alloy solders having different constituent ratios than those mentioned above, and other solder materials belonging to the group of Sn, Ag alloys; Au, Sn alloys; Au, Ge alloys; and Au, Si alloys are also acceptable. In any case, the aligning operation is easily performed in an oxidizing atmosphere, and the soldering operation in a nonoxidizing furnace, using a simple facility.

FIG. 6 plots oxide film thickness versus exposure time at room temperature (solid-line curves), with the preferred permissible oxide film thickness of 5 nm noted on the Y axis. The upper limit of exposure time can be obtained qualitatively from the relation between exposure time and oxide thickness as graphed, namely about six hours or more depending upon the soldering material, which is substantially coincident with the results obtained and described above with respect to the embodiments of FIGS. 4(a)–4(d) and 5(a)–5(c). Further, as shown by dotted lines in FIG. 6, the speed of oxide film growth increases with temperature. Therefore, the exposure time in the oxidizing atmosphere should be made shorter with increasing temperature.

In order to solder the members with a soldering material that has a reoxidized film whose thickness is that obtained after sputter-cleaning, the soldering material should satisfy the following conditions: minimum void, good wettability for the member to be soldered, resultant soldering material shape corresponding to that defined by surface tension thereof, self-alignment to correct any deviation during soldering, and high reliability (where T~ is the high temperature strength, and ~ is the number of cycles). Soldering junctions obtained by the present invention ($H_2/N_2$ atmosphere) and by the conventional method (without sputter-cleaning, with and without flu are shown in Table 1.

TABLE 1

| Solder | Wettability (>100%) | Void | Shape | Self-align | Temp. cycle (T ~ test for −55 to +150° C., after 1,000 ~ ) |
|---|---|---|---|---|---|
| INVENTION ($H_2/N_2$ FURNACE) | | | | | |
| 1. Pb2Sn | ○ | small | ○ | ○ | ○ |
| 2. Pb5Sn | ○ | small | ○ | ○ | ○ |
| 3. Pb10Sn | ○ | small | ○ | ○ | ○ |
| 4. Sn37Pb | ○ | small | ○ | ○ | ○ |
| 5. Sn3.5Ag | ○ | small | ○ | ○ | ○ |
| 6. Au12Ge | ○ | small | ○ | ○ | — |
| PRIOR ART ($N_2$ FURNACE) FLUX | | | | | |
| 1. Pb2Sn | ○ | large | ○ | ○ | Δ(2) |
| 2. Pb5Sn | ○ | large | ○ | ○ | Δ(3) |
| 3. Sn37Pb | ○ | large | ○ | ○ | Δ(5) |
| 4. Sn3.5Ag | ○ | large | ○ | ○ | Δ(2) |
| PRIOR ART ($N_2$ FURNACE) NON-FLUX | | | | | |
| 5. Pb5Sn | X | small | X | X | — |
| 6. Sn3.5Ag | X | small | X | X | — |
| 7. Au12Ge | X | small | Δ | Δ | — |

Note: ○ denotes a good result; Δ denotes an acceptable, but not good, result; and × denotes a bad result. The number in parentheses in the Temperature cycle column for the conventional method using flux denotes the number of damaged junctions among 20 junctions tested. The solder junction obtained according to the present embodiment exhibits good wettability, shape, and self-alignment characteristics, similar to those obtained by the conventional method using flux. Any voids are very small, which may be due to the nonuse of flux. As to the temperature cycle duration, the present invention betters that of the conventional method using flux. Further, the conventional method using no flux exhibits worse results for each factor. The same results are obtained for other inert gas furnaces, such as an Ar furnace, a He furnace, a $N_2$ furnace, and a fluorocarbon (e.g., Freon) vapor furnace. However, in these furnaces, the oxygen concentration should be restricted to about 10 ppm or lower. Further, a reducing gas furnace of, for example, $H_2/N_2$ or $H_2$ gas, may be used. Regardless of the furnace, the fluxless soldering method economically produces a reliable electronic device that has a large thermal capacity by soldering in an oxidizing atmosphere, which improves upon the prior art method in the workability thereof, using a simple facility and generating no significant pollution by comparison An embodiment of a fluxless soldering apparatus according to the invention is illustrated in FIG. 7, which shows a sputter-cleaning device 100 and a belt furnace 200, between which an alignment mechanism 300 is provided. The sputter-cleaning device 100 includes a plenum chamber 101, a cleaning chamber 102, and an outlet chamber 103. A conventional gas introducing system supplies gas at 106 to the plenum chamber 101 and outlet chamber 103, which are purged by evacuation and subsequent communication to atmosphere at 105. Gate valves 141, 142, 143, and 144 provide access to the various chambers.

Gas is supplied to a gun 107 provided within the cleaning chamber 102 to emit ions and/or atoms. Solder portions (solder balls, connecting pads, etc.) of one or more members 14 in the sputter-cleaning device 100 are irradiated simultaneously with the ions and/or atoms to remove oxide films and/or organic contamination films thereon. The cleaning chamber 102 is evacuated at 105. The member 14 thus cleaned is transported to the alignment mechanism 300, and after alignment is transported to the belt furnace 200, preferably by one or more belt conveyors.

The belt furnace 200 includes a plenum chamber 210, a heating and welding chamber 211, and a cooling chamber 212, all of which can be evacuated, and which are accessible by gate valves 245, 246, 247, and 248. Each chamber of the belt furnace 200 is equipped with an evacuating system 205 and a gas introducing system 206, for purging and introduction of nonoxidizing gas, respectively. Alternatively, the evacuation system may be omitted if an inert gas such as $N_2$, Ar, or He is substituted for the nonoxidizing gas. The member 14 is transported through the belt furnace 200 via the respective chambers 210, 211, and 212 by belt conveyors 13.

Figure 8:
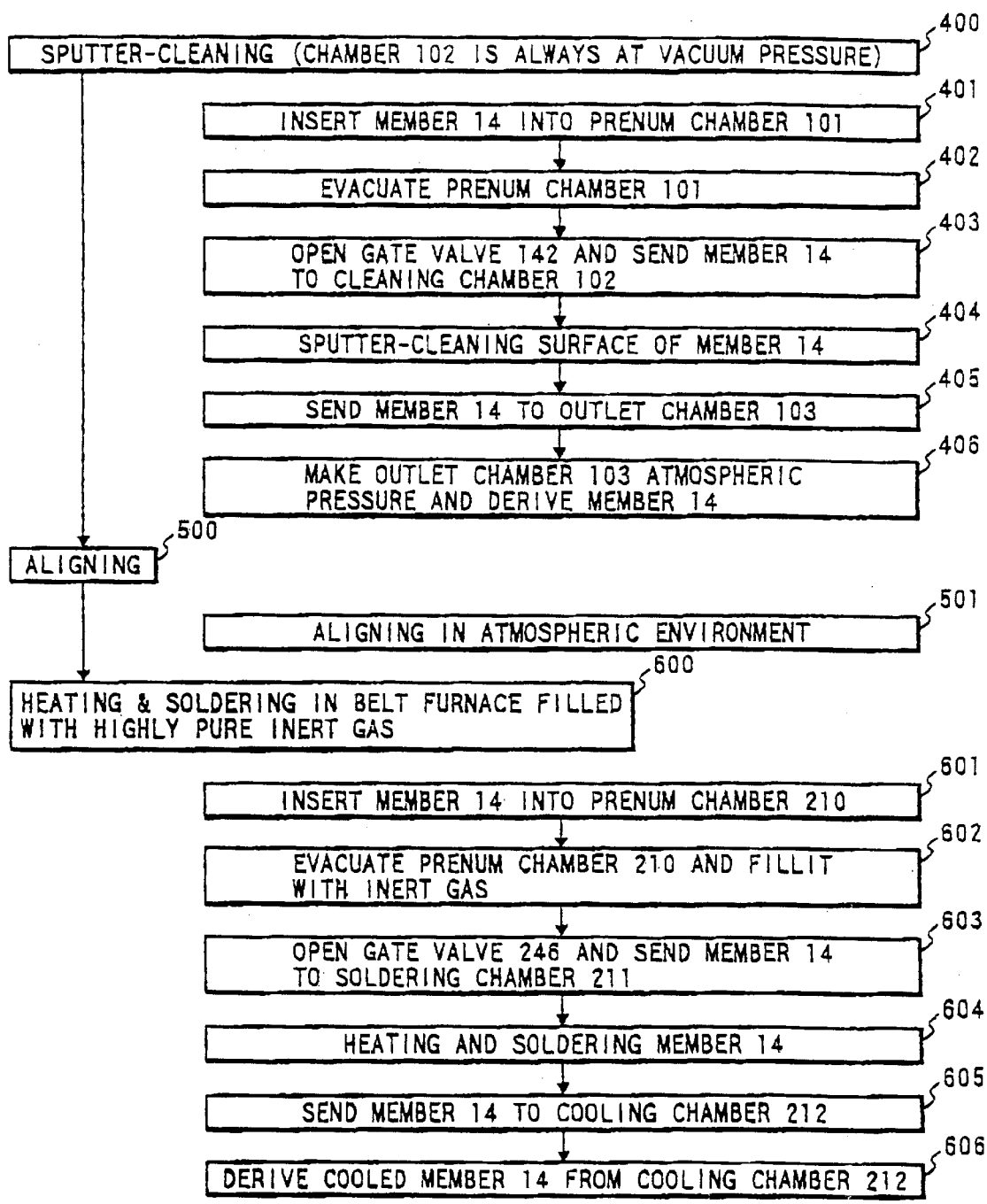
FIG. 8 is a flowchart showing an operation of the apparatus illustrated in FIG. 7.

FIG. 8 is a flowchart illustrating a fluxless soldering operation performed by the apparatus of FIG. 7. It is assumed that all of the gate valves 141 to 144 and 245 to 248 are initially closed.

At step 400, any oxide film or organic contaminating film on the bonding pads of the member 14 and on the solder portions is sputter-cleaned by the sputter-cleaning device 100. The sputter-cleaning is performed according to steps 401–406, which are considered to be included in step 400. Throughout the cleaning process, the cleaning chamber 102 is continuously evacuated so that a vacuum pressure higher than $10^{-5}$ Torr is maintained therein.

In step 401, the gate valve 141 of an inlet to the plenum chamber 101 of the sputter-cleaning device 100 is opened to admit the presoldered member 14. In step 402, the plenum chamber 101 is evacuated. When there is significant gas and/or water content adsorbed by the member 14, heating is performed simultaneously with the evacuation of the plenum chamber 101, to thereby prevent the vacuum condition in the subsequent cleaning chamber 102 from being degraded. A baking device may be provided at the front of the plenum chamber 101. The baking device may perform evacuation and heating.

In step 403, the gate valve 141 between the plenum chamber 101 and the cleaning-chamber 102 is opened so that the member 14 is transported into the cleaning chamber 102. Thereafter, the gate valve 145 is closed and, in step 404, the member 14 in the cleaning chamber 102 is irradiated with ions and/or atoms 108 from the gun 107 while being rotated, to remove undesired films on the solder and the connecting pads.

In step 405, the outlet side gate valve 143 of the cleaning chamber 102 is opened, the cleaned member 14 is transported into the outlet chamber 103 at vacuum pressure, and the gate valve 143 is closed. Then, in step 406, the outlet chamber 103 is adjusted to atmospheric pressure and its outlet side gate valve 144 is opened so that the member 14 can be removed.

In step 500, two cleaned members 14 are aligned by an alignment mechanism 300 in an atmospheric environment.

In step 600, fluxless soldering is performed in the belt furnace 200. A nonoxidizing atmosphere is continuously maintained in the heating and welding chamber 211 of belt furnace 200 (FIG. 7) by evacuation and subsequent introduction of a nonoxidizing gas.

Step 600 includes steps 601 to 606. In step 601, the inlet side gate valve 245 of the plenum chamber 210 is opened to admit the aligned embers 14 into the plenum chamber. In step 602, the plenum chamber is evacuated and then filled with the nonoxidizing gas.

In step 603, the gate valve 246 between the plenum chamber 210 and the heating and soldering chamber 211 is opened to permit the members 14 to enter the heating and soldering chamber, and, in step 604, the gate valve 246 is closed. The members 14 are then heated to melt the solder.

In step 605, the gate valve 247 between the heating and soldering chamber 211 and the cooling chamber 212 is opened to permit the soldered members 14 to be transported into the cooling chamber. After the cooling, the cooling chamber 212 is adjusted to atmospheric pressure and the members 14 are removed through the gate valve 248.

The concentration of the nonoxidizing gas in the heating and soldering chamber 211 can be selected arbitrarily on the basis of the vacuum pressure to be established therein and on the concentration of the inert gas to be introduced. Therefore, the apparatus according to this embodiment can be used suitably for the fluxless soldering of any combination of solder material and members 14 to be bonded thereby.

When a solder material is employed that exhibits superior wettability, such as a Sn-containing solder material, the plenum chamber 210 and the cooling chamber 213 may be omitted, and the cooling chamber 212 may be filled with an inert gas such as $N_2$, Ar, or He. Moreover, it is possible to restrict the oxygen concentration further by introducing $H_2$ into the inert gas and allowing a reaction between the $H_2$ and residual. Alternatively, the evacuation systems of the belt furnace may be omitted in favor of a belt furnace in which the atmospheric gas is replaced by the inert gas.

Figure 9:
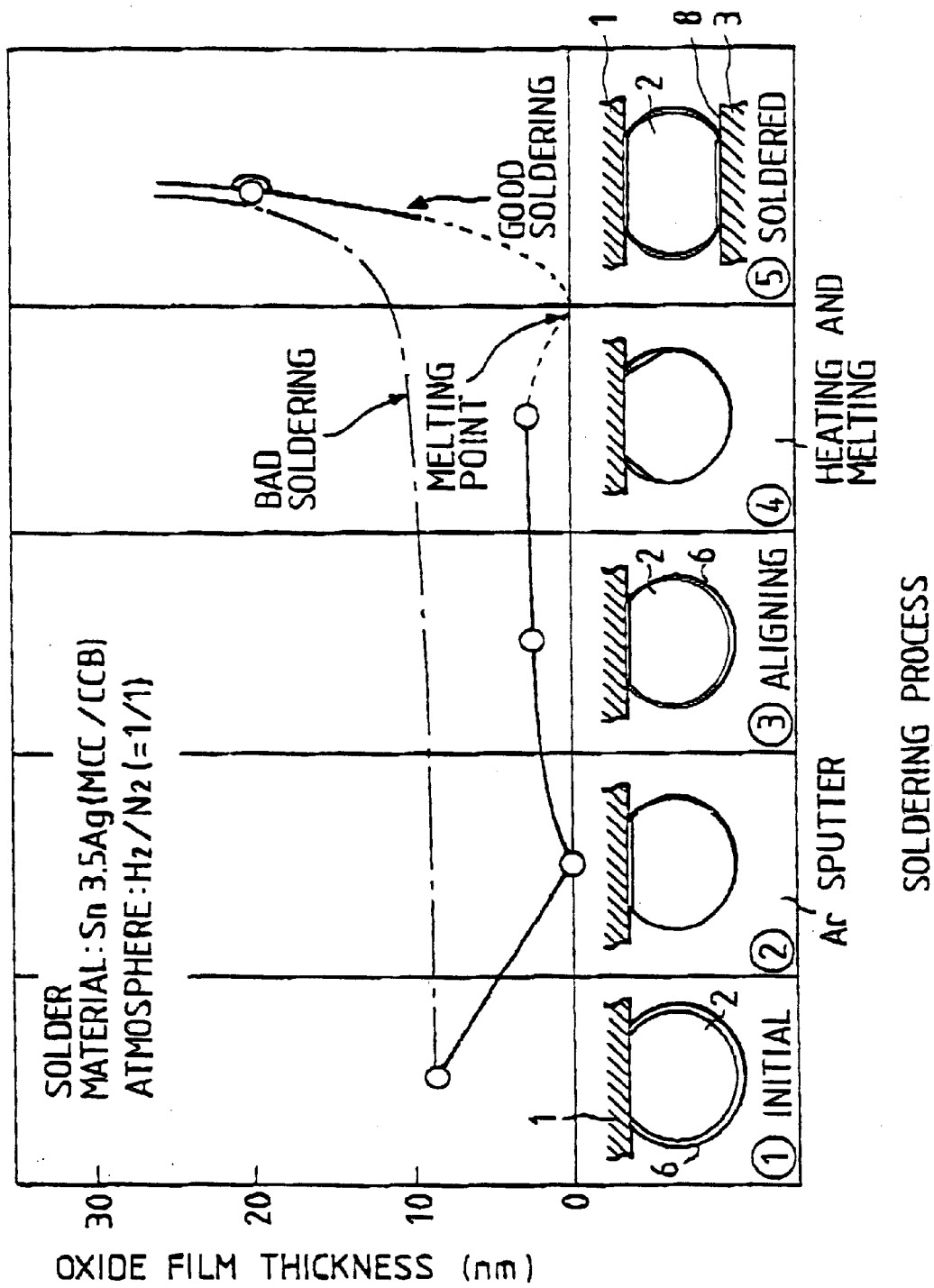
FIG. 9 is a graph showing an example of soldering according to the steps of FIGS. 3(a)–3(e)

FIG. 9 illustrates, using a solid line, a variation of thickness of an oxide film on the solder ball 2 for the states shown in FIGS. 3(a)–3(e) when the solder ball is of Sn3.5Ag (MCC/CCB) in an $H_2/N_2$ (1:1) atmosphere, and the solder bonds a ceramic chip 1 to a substrate 3. As shown, the initial oxide film thickness of about 10 nm in the initial state shown in FIG. 3(a) is reduced to almost zero in the sputtering state shown in FIG. 3(b), and then gradually increases to about 2 to 3 nm until heating in FIG. 3(d). Heating fractures the oxide film 6 to expose a clean surface at which the bonding takes place in FIG. 3(e). Thereafter, the thickness of the oxide film continues to increase. A chain line in FIG. 9 shows the thickness of the oxide film in the absence of the invention.

FIGS. 10(a) through 10(d) show an example of a method for welding solder balls 2 to bonding pads 8 of, for example, a substrate of a large-scale integrated circuit (LSI).

Figure 10A:
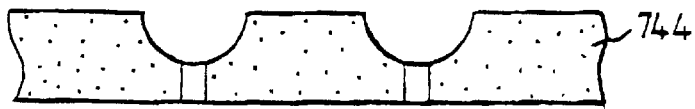
FIGS. 10(a)–10(d) illustrate steps of welding solder balls to a printed circuit board.
Figure 10B:
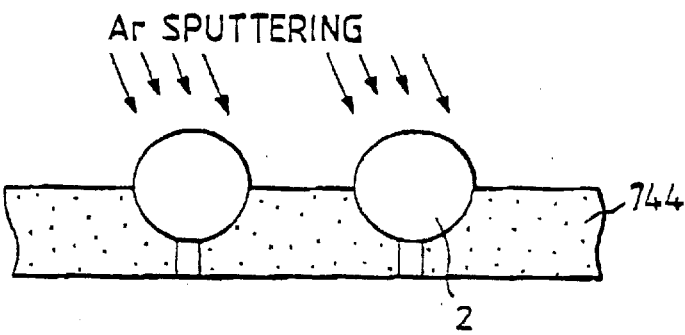

First, as shown in FIG. 10(a), a positioning plate 744 is prepared. The positioning plate may be fiberglass, and has recesses for receiving the solder balls 2. The solder balls are supplied onto the positioning plate 744 and deposited into the recesses by vibrating the positioning plate. The solder balls are held in the recesses by applying negative pressure via respective ducts in the recesses. Then, as shown in FIG. 10(b), the solder balls 2 are sputtered by irradiation with, for example, a beam of Ar atoms to remove any oxide film thereon.

Figure 10C:
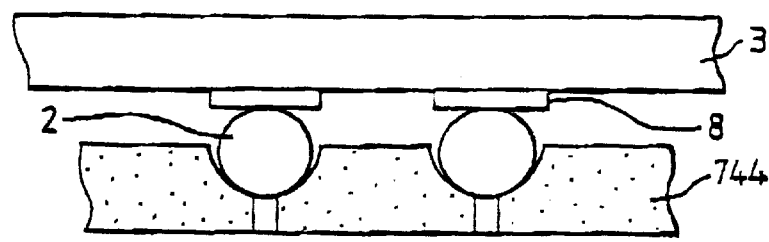
Figure 10D:
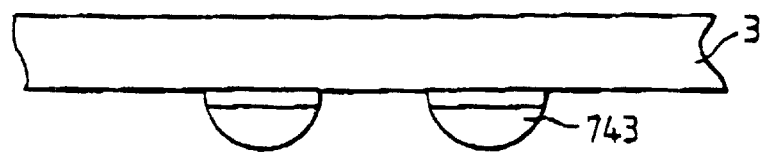

Next, as shown in FIG. 10(c), a printed circuit board 3 is oriented over the solder balls 2 so that the solder balls align with bonding pads 8 of the circuit board. Then, the solder balls are heated to melt the solder and bond the solder balls to the respective bonding pads, as shown at 743 in FIG. 10(d).

Figure 11:
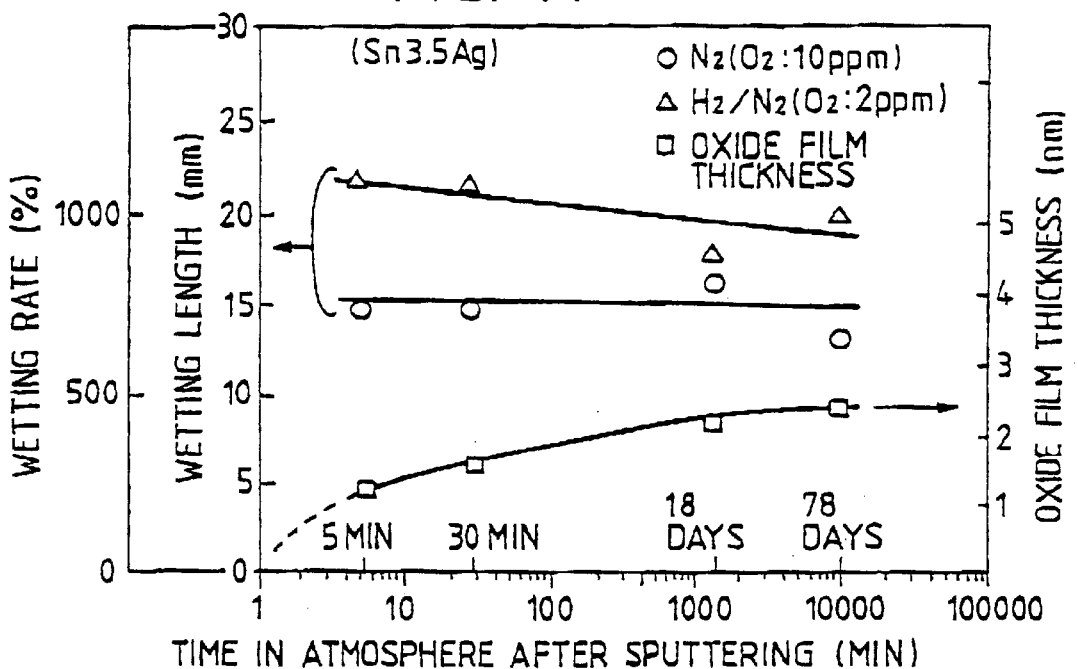
FIG. 11 is a graph showing details of oxide film thickness and soldering characteristics of a solder ball, during which the solder ball is in an atmospheric environment.

FIG. 11 plots the oxide film thickness, wetting rate, and wetting length of the solder against time in the atmosphere after sputter-cleaning. The curve tracing a succession of points marked by squares shows the variation of oxide thickness over time on a solder ball of Sn3.5Ag; the curve tracing a succession of points marked by circles shows the wetting rate over time when identical solder balls are welded to bonding pad surfaces similarly sputter-cleaned in the belt furnace 200 shown in FIG. 7 using $N_2$ gas; and the curve tracing a succession of points marked by triangles shows the wetting length over time when identical solder balls are welded to bonding pad surfaces similarly sputter-cleaned in the belt furnace 200 shown in FIG. 7 using $H_2/N_2$ gas.

As is clear from FIG. 11, the thickness of the oxide film on the solder reaches 1 nm within several minutes after being put in an atmospheric environment, and never increases beyond 2 to 3 nm even after several days. As mentioned previously with respect to FIGS. 3(*a*)–3(*e*), the heating and soldering process may be performed in the belt furnace 200 so long as the oxide film thickness is not more than 2 to 3 nm. Further, FIG. 11 shows that, although the wetting length and wetting rate characteristics are reduced slightly with time in the atmospheric environment, the wettability is still acceptable even after seven days.

Since FIG. 11 shows that it takes a very long time for the thickness to reach 5 nm, which may be considered the practical upper limit, there is no need to limit the time for which the solder material can by put in the atmospheric condition after being sputter-cleaned.

Figure 12:
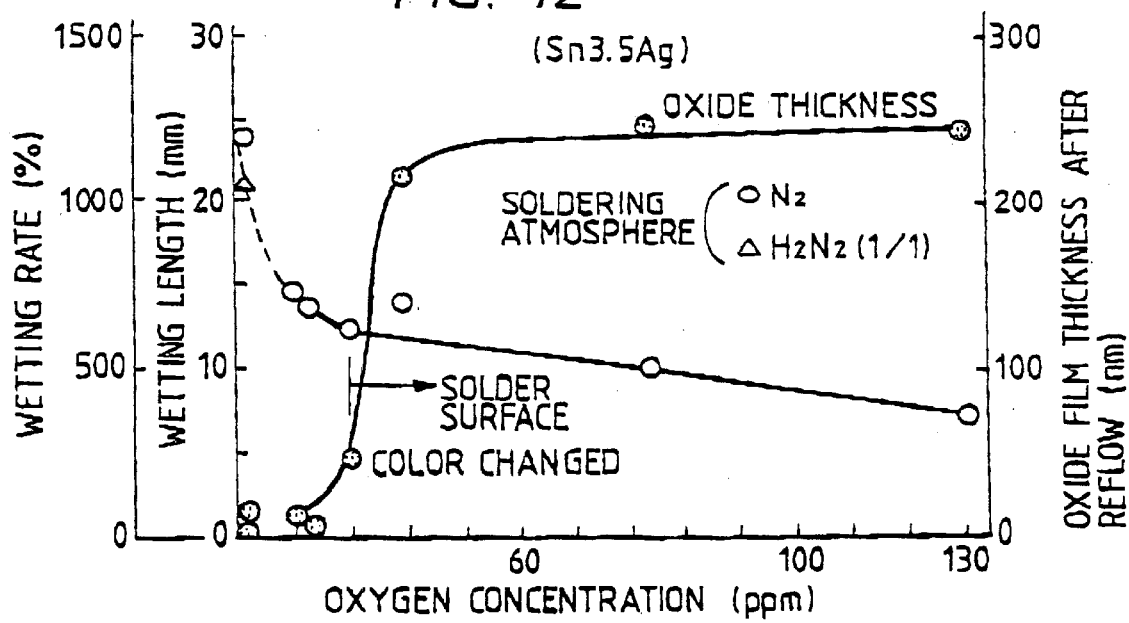
FIG. 12 is a graph showing the relationship between atmospheric oxygen concentration during soldering and oxide film thickness and soldering characteristics of the solder ball.

FIG. 12 shows plots of the thickness of the oxide film on a solder ball of Sn3.5Ag and the wetting rate and wetting length thereof when soldered in the belt furnace 200 with respect to the oxygen concentration in the belt furnace.

When the oxygen concentration exceeds 20 ppm, the oxide film thickness increases abruptly, to beyond 20 nm. Further, the wetting rate and wetting length are reduced remarkably until the oxygen concentration reaches 20 ppm. Beyond 20 ppm, the color of the solder surface changes to light violet, and the solder becomes, practically, useless.

Figure 13:
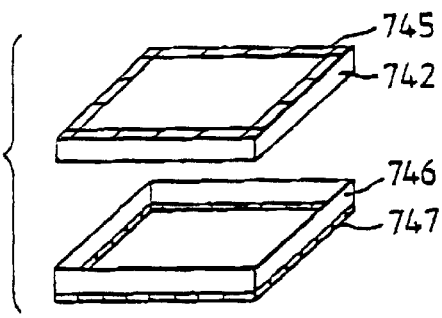
FIG. 13 is a perspective view of a substrate and a roof plate.
Figure 14A:
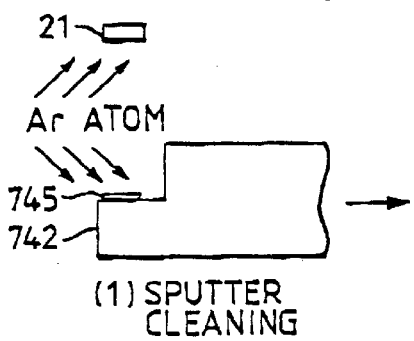
FIGS. 14(a)–14(f) show steps for soldering the frame of a roof plate to a substrate, according to the present invention.
Figure 14B:
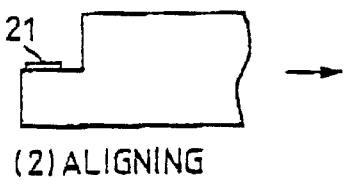
Figure 14C:
Figure 14D:
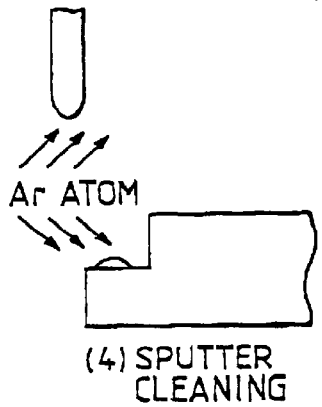
Figure 14E:
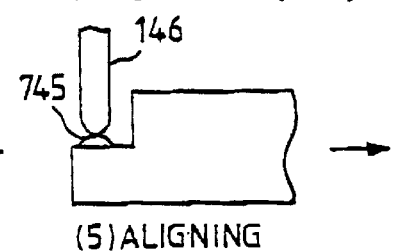
Figure 14F:
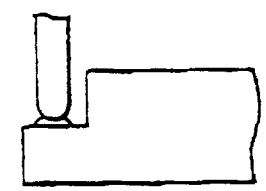

Next, an embodiment will be described with reference to FIGS. 13 and 14(*a*) through 14(*f*), in which a roof plate 747 having a frame 746 is bonded to a substrate 742 having a metallized portion 745.

As shown in FIG. 14(*a*), the metallized portion 745 and solder 21 are sputtered with Ar ions to remove an oxide film from the solder 21. The solder 21 is then put on the metallized portion 745 as shown in FIG. 14(*b*). Then, as shown in FIG. 14(*c*), the solder 21 is melted in a nonoxidizing atmosphere.

Thereafter, the frame 746 and the solder 21 on the metallized portion 745 are again ion-sputtered as shown in FIG. 14(*d*), the frame 746 is aligned with the metallized a portion 745 as shown in FIG. 14(*e*), and the frame and metallized portion are reflow soldered in a nonoxidizing atmosphere as shown in FIG. 14(*f*).

Figure 15:
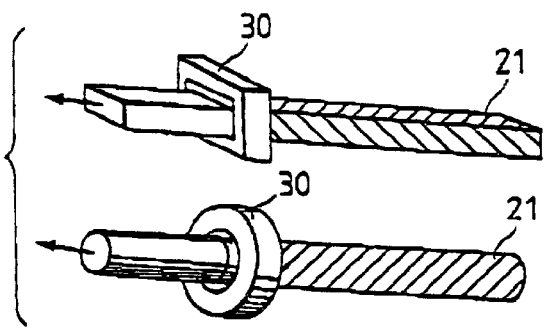
FIG. 15 illustrates a method of mechanically removing an oxide film from a solder surface, according to the present invention.

FIG. 15 illustrates another embodiment of oxide film removal according to the present invention. In this embodiment, mechanical removal of the oxide film is employed instead of sputter cleaning. FIG. 15 illustrates solder material 21 that is formed as a rod having a rectangular cross-section or a circular cross-section. The solder rod can be passed through a corresponding die 30 having a cross-section smaller than that of the solder rod 21. Similarly, the oxide film removal shown in FIGS. 3(*a*)–3(*e*) may be performed by polishing or cutting a top portion of the solder ball 2. The mechanical oxide film removal can be used in combination with the sputter cleaning.

FIGS. 16(*a*) and 16(*b*) illustrate a method of welding solder balls 2 to pads 743 on a mechanically-polished substrate 742.

As shown in FIG. 16(*a*), the solder balls 2 are located in recesses of a positioning plate 744 of, for example, glass fiber, and held stably therein as in the case shown in FIG. 10(*b*). Top portions of the positioning plate 744 are polished by laterally moving or vibrating a polishing cloth 40. Then, as shown in FIG. 16(*b*), the pads 743 on the substrate 742 are brought into contact with the solder balls 2 whose top portions are polished and heated in a nonoxidizing atmosphere.

FIGS. 17(*a*) and 17(*b*) illustrate a mechanical polishing method for polishing top portions of solder balls 2, which are welded to pads 743 on a substrate 742. As shown in FIG. 17(*a*), the top portions of the solder balls 2 are polished by laterally moving or vibrating a polishing cloth 40. Thus, oxide films 6 on the top portions of the solder balls 2 are removed and solder material is exposed as shown in FIG. 17(*b*). By welding the exposed portions of the solder balls 2 to the pads 743 in a nonoxidizing atmosphere, satisfactory bonding can be obtained.

The oxide films and the contaminant organic films covering the solder balls and the pads may be removed alternatively by a method using a laser beam. The laser beam may be projected on the oxide films in atmospheric conditions, in a vacuum, or in an atmosphere of He gas, to remove the oxide films and the contaminant organic films.

Figure 18:
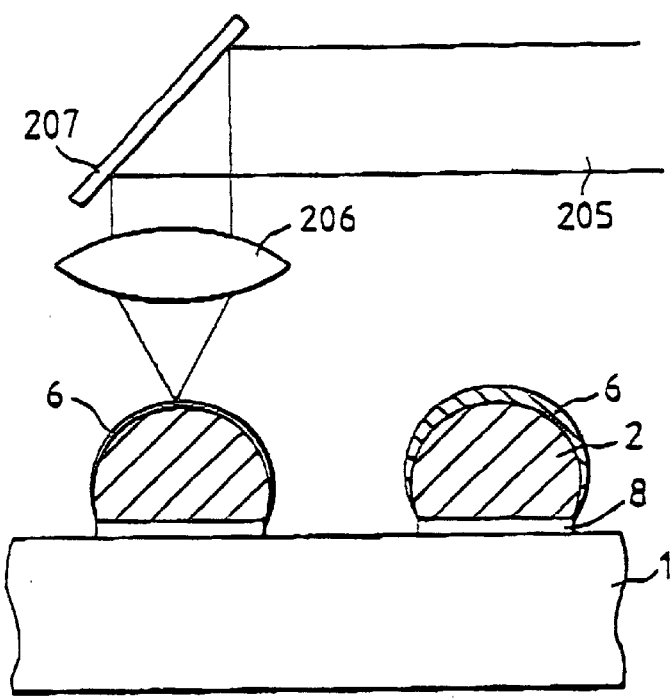
FIG. 18 is a sectional view illustrating a method of laserbeam cleaning a solder ball attached to an LSI chip.

FIG. 18 illustrates a cleaning method for cleaning solder balls welded to the substrate of an LSI circuit by using a laser beam. FIG. 18 shows the substrate 1 of an LSI circuit, metallized pads 8, solder balls 2, oxide/contamination layers 6 coating the surfaces of the solder balls 2, a laser beam 205, a lens 206, and a mirror 207. This method irradiates the surfaces of the solder balls 2 with the laser beam 205 to remove the oxide/contamination layers coating the surfaces of the solder balls 2.

Figure 19:
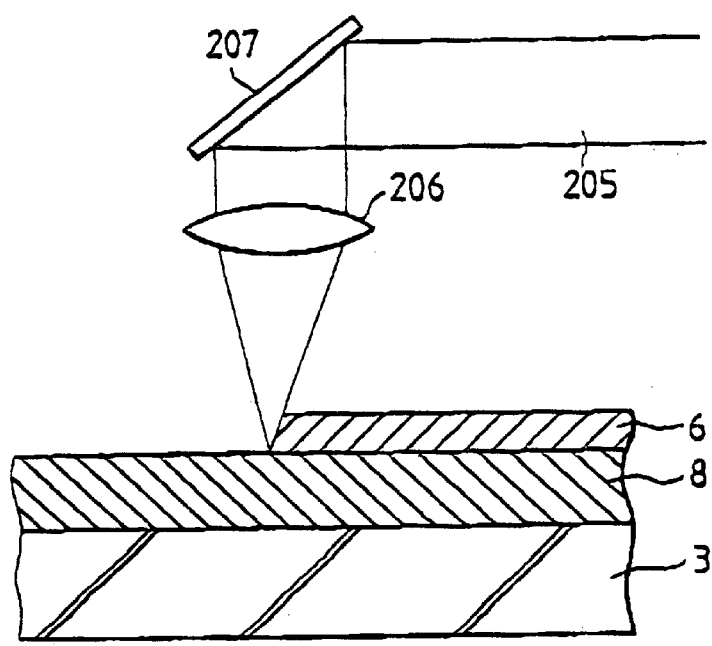
FIG. 19 is a sectional view illustrating a method of laserbeam cleaning a metallized surface of a member.

FIG. 19 illustrates a cleaning method for cleaning a metallized layer formed on the surface of a member, using a laser beam in accordance with the present invention. This method is capable of removing an oxide/contamination layer 6 coating the surface of the metallized layer 8 on a ceramic substrate 3.

The cleaning methods illustrated in FIGS. 18 and 19 cause the oxide/contamination layer coating the metal surface to evaporate by the energy of the laser beam 205, whereby the metal surface is melted, Therefore, the oxide film or contaminous film must be efficiently removed by irradiating the oxide/contamination layer with the laser beam 205 for a comparatively short time to prevent the reoxidation of the metal surface and to form no more than a thin oxide film, so that the members are bonded together satisfactorily by fluxless welding (soldering). For example, a pulse laser beam having a pulse width of 1 microsecond or below, a short wavelength, and a high photon energy, emitted by an excimer laser such as an Xe—Cl laser (wavelength 308 nm), is preferred. The energy density and the number of pulses to be applied to the object are determined according to the type of metal on which the oxide/contamination layer is present, and to form, preferably, a thin oxide film of no more than 5 nm. With these parameters, the person of ordinary skill can readily practice this embodiment of the invention.

FIG. 20 graphically illustrates the variation of thickness of thin oxide films formed over the surface of solder balls shown in FIGS. 15–19 against time, when the solder balls are kept in the atmosphere after mechanical cleaning, laser beam cleaning, and sputter cleaning. Blank triangles, solid circles, and blank circles represent solder balls subjected to laser beam cleaning, mechanical cleaning, and sputter cleaning, respectively. FIG. 20 indicates that there is no significant difference between these cleaning processes with regard to the formation of the thin oxide film.

The primary object of the foregoing embodiments of the present invention is the removal of oxide films by sputter cleaning, mechanical cleaning, or laser beam cleaning. However, the processes of sputter cleaning and mechanical cleaning can be omitted if the surfaces of, e.g., the solder balls are surface-treated so that no oxide film may be formed.

Figure 21A:
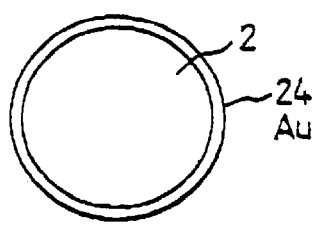
FIGS. 21(a)–21(e) show steps of welding a gold-plated solder ball to a substrate or part.
Figure 21B:
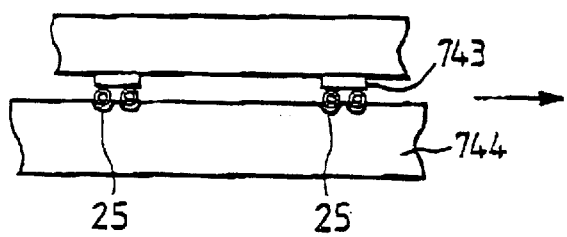
Figure 21C:

FIG. 21(a) illustrates a surface of a solder ball 2 which is plated with gold 24. The gold-plated solder balls 2 are located in recesses of a plate 744, and a substrate 742 having pads 743 is put on the plate 744 so that the pads 743 align with the solder balls 2, as shown in FIG. 21(b). Then, the solder balls are welded to the pads as shown in FIG. 21(c).

Figure 21D:
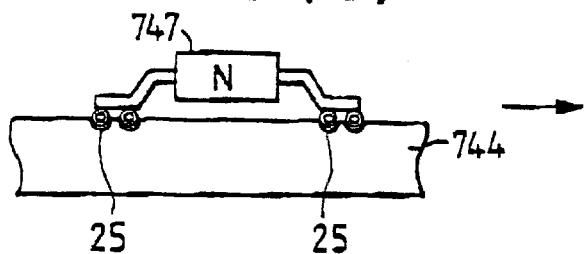
Figure 21E:
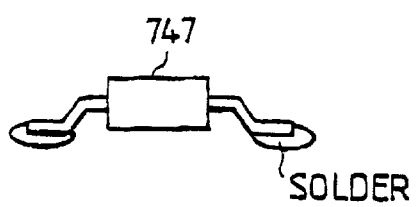

Similarly, as shown in FIGS. 21(d) and 21(e), the solder balls can be welded to leads of electronic parts 747. In this case, the pads 743 and/or the leads of the electronic parts 747 may be sputter-cleaned, mechanically-cleaned, or gold-plated.

The gold layer 24 on the solder ball 2 can be formed by, for example, a barrel plating technique. In barrel plating, solder balls 2 are put in a plating cage, which is dipped in a plating liquid while stirring the liquid.

The solder ball itself may be formed by an atomizing technique or by an oil tank method.

In the atomizing method, molten solder is dropped in a nonoxidizing atmosphere onto a surface, and takes the form of spherical particles due to surface tension. The solder particles are solidified and separated by size.

In the oil tank method, a predetermined number of solder pellets are thrown into an oil tank, and the oil is heated to a temperature greater than or equal to the melting point of the solder. The pellets are thus melted at a surface portion of the oil in the tank, and sink to a lower portion in the tank, where the temperature is lower than that of the surface. Thus, the solder pellets resolidify in spherical form due to their own surface tension.

The solder balls thus formed have an oxide film thereon. Therefore, they must be reduced in a diluted acid solution, and then plated with gold in the barrel plating tank.

It will be recalled that the fluxless soldering apparatus shown in FIG. 7 includes an alignment mechanism 300 for aligning two members to be soldered together. In this mechanism, the two members are aligned with each other, but are not temporarily fixed to each other prior to the soldering. Therefore, there is a risk that these two members will become misaligned due to vibrations experienced during transportation to the belt furnace 200 and/or transportation thereof within the belt furnace.

FIGS. 22–25 show alignment means for facilitating alignment of the two members and for preventing misalignment after the initial alignment.

Figure 22A:
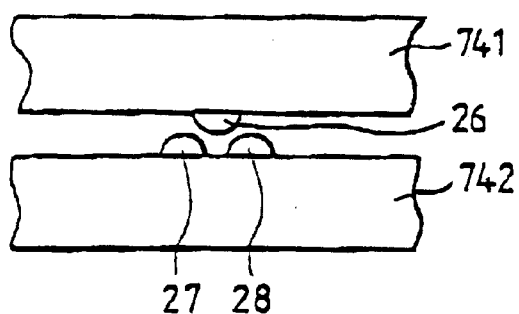
FIGS. 22(a)–22(b), 23(a)–23(b), 24(a)–24(b), and 25 are cross-sections illustrating member alignment according to the present invention.
Figure 22B:
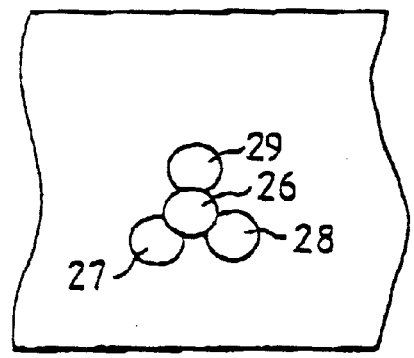

As shown in FIG. 22(a), a solder ball 26 protrudes from a member 741, which is to be soldered to a member 742. Moreover, a plurality of such solder balls protrude from corresponding portions of the member 742. In this embodiment, three solder balls 27, 28, and 29 are provided at respective apices of a triangle forming the protrusion means on the member 742. A central space is included in the three solder balls 27, 28, 29, as shown in FIG. 22(b). The positioning of the members 741 and 742 is performed by locating the solder ball 26 in the central space included in the triangularly-arranged solder balls 27, 28, 29.

By locating the solder ball 26 in the central space, there is no possibility for deviation in the positioning, and thus the accuracy of alignment is improved compared with the prior art scheme. Further, by providing at least two such combinations of solder balls, the alignment of members 741 and 742 can be made more exact.

Preferably, the solder balls are isolated electrically from conductive wirings of any electronic circuit associated with the members to be bonded together.

Figure 23A:
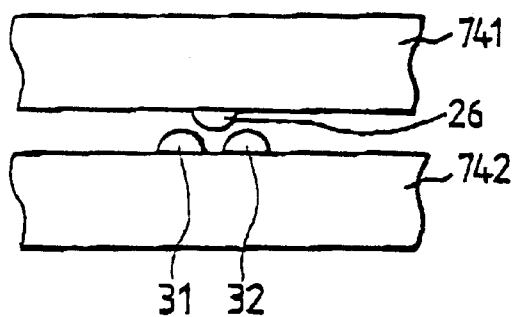
Figure 23B:
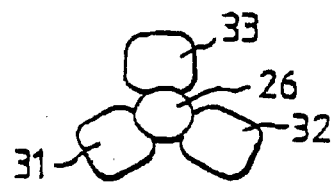

FIGS. 23(a) and 23(b) show another embodiment of the alignment in which the solder balls 27, 28, 29 are replaced by protrusions 31, 32, 33. The effect of this embodiment is substantially the same as that of the embodiment shown in FIGS. 22(a) and 22(b).

The protrusions 31, 32, 33 are constituted by a material such as PIQ resin, which may have a melting point sufficiently high that the resin melts little, if at all, at the soldering temperature or, if melted, has sufficient viscosity to prevent any mutual deviation in position between the members to be bonded.

Figure 24A:
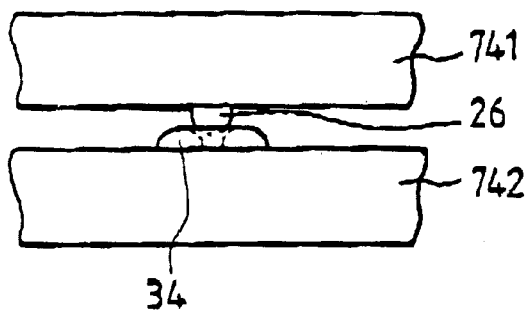
Figure 24B:
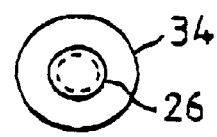

FIGS. 24(a) and 24(b) illustrate another embodiment in which, instead of the solder balls 27–29 or the protrusions 31–33, a ring-shaped protrusion 34 is employed. The protrusion 34 may be constituted by a solder material or a resin, as discussed above with respect to FIGS. 22(a), 22(b) and 23(a), 23(b), respectively. Each protrusion 34 has a center recess in which a solder ball bonded to the opposite member is received. Other modifications of this alignment means are possible so long as mutual deviation of the members to be bonded is prevented.

The ring-shaped protrusion 34 is preferably employed when the alignment area is limited. Solder balls are preferred when the alignment area is larger.

Figure 25:
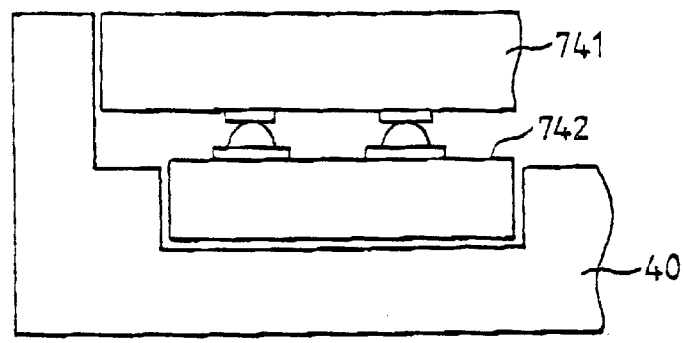

FIG. 25 illustrates an embodiment in which a jig 40 is used to maintain alignment of the members 741, 742.

An embodiment of the present invention that uses a liquid organic material for temporary fixation of the members to be bonded will be described in detail as applied to the mounting of electronic parts on a ceramic substrate, using $Sn_3Ag$ solder.

The melting point of $Sn_3Ag$ solder is 222° C. An organic material having an appropriate boiling point may be applied to the members before their alignment. The organic material must not contain flux and must evaporate without leaving any residue when heated. For example, the organic material may be a hydrocarbon, ketone, ester, aldehyde, or alcohol. An organic material having at least one hydroxyl group is particularly preferred because such an organic material can reduce and remove an oxide film coating the surface of a member to be soldered. Table 2 shows representative organic materials having at least one hydroxyl group.

TABLE 2

(under 1 atm pressure (760 Torr))

| Material | Chemical Formula | M.P. (° C.) | B.P. (° C.) |
| --- | --- | --- | --- |
| Propylene glycol | $CH_3CHOHCH_2OH$ | −60 | 188 |
| Ethylene glycol | $HOCH_2CH_2OH$ | −13 | 198 |
| Benzyl alcohol | $C_6H_5CH_2OH$ | −15 | 206 |
| Trimethylene glycol | $HOCH_2CH_2CH_2OH$ | −27 | 214 |
| Dipropylene glycol | $H(OC_3H_6)_2OH$ | −40 | 232 |
| 2-Phenoxyethanol | $C_6H_5(OCH_2CH_2)OH$ | −25 | 245 |
| Diethylene glycol | $H(OCH_2CH_2)_2OH$ | −7 | 245 |
| Tripropylene glycol | $H(OCH_2CH_2CH_2)OH$ | −20 | 273 |

TABLE 2-continued (under 1 atm pressure (760 Torr))

| Material | Chemical Formula | M.P. (° C.) | B.P. (° C.) |
|---|---|---|---|
| Triethylene glycol | $H(OCH_2CH_2)_2OH$ | −7 | 285 |
| Glycerol | $HOCH_2CHOHCH_2OH$ | 18 | 290 |
| Tetraethylene glycol | $H(OCH_2CH_2)_4OH$ | −6 | 314 |
| 3-Phenoxy-1, 2-propanediol | $C_6H_5OCH_2CHOHCH_2OH$ | 55 | 315 |
| Pentaethylene glycol | $H(OCH_2CH_2)_5OH$ | 0 | 370 |
| Hexaethylene glycol | $H(OCH_2CH_2)_6OH$ | 6 | 400 |

The organic material further ensures fixation after alignment, and shields the bonding portions effectively from the atmosphere. Preferably, the organic material is applied to the bonding portions such that adjacent bonding portions are separated from each other and discontinuous. Thus, the organic material is applied to the individual bonding portions, or forms a film around the bases of the electrodes of a wiring board or connecting terminals of an electronic part.

An organic material having an appropriate boiling point must be selected from those shown in Table 2, while taking into consideration the different evaporation rates of the organic materials in a heated atmosphere. Examinations have proved that the evaporation rate of an organic material in an He atmosphere is higher than those of the same organic material in an Ar atmosphere and in an $N_2$ atmosphere, and that the boiling point of an organic material to be used in an He atmosphere must be higher by 20° C.–30° C. than that of an organic material to be used in an Ar atmosphere or $N_2$ atmosphere.

FIGS. 26(a)–26(f) illustrate processes of manufacturing an electronic circuit device according to a preferred embodiment of the present invention. An electronic part (LSI chip) 1 is mounted on a ceramic substrate 3, to temporarily fix the electronic part 1 with a liquid organic material 301, and to bond the electronic part 1 to the ceramic substrate 3 by reflow soldering.

Figure 26A:
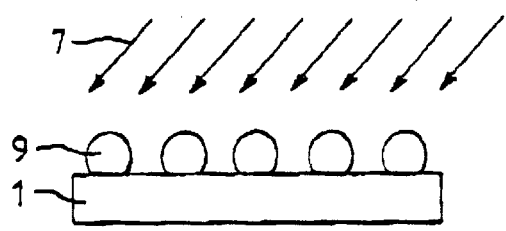
FIGS. 26(a)–26(f) are sectional views of a workpiece in different phases of an electronic circuit device fabricating method according to a preferred embodiment of the present invention.
Figure 26B:
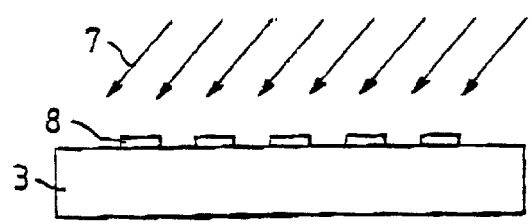

FIGS. 26(a) and 26(b) are sectional views illustrating a pretreatment process for cleaning the surfaces of the electronic part 1 and the ceramic substrate 3. Preferably, this embodiment uses an Ar atom beam 7 for cleaning, although the surfaces may be cleaned by a mechanical cleaning process or with a laser beam.

Figure 26C:
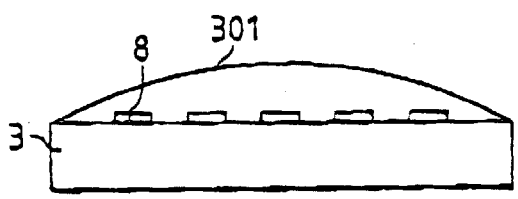

FIGS. 26(c)–26(f) illustrate the processes for bonding by reflow soldering, carried out after the surfaces have been cleaned. As shown in FIG. 26(c), the liquid organic material 301 is applied to the surface of the ceramic substrate 3 to cover all bonding portions 8 until the electronic part 1 is bonded completely to the ceramic 25 substrate 3, and to reduce oxide films coating solder balls 9. When reflow soldering is carried out in an Ar or $N_2$ atmosphere, 2-phenoxyethanol (B.P.: 245° C.) is suitable. When reflow soldering is carried out in an He atmosphere, triethylene glycol (B.P.: 285° C.) is suitable.

Figure 26D:
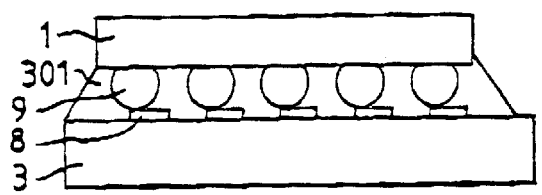

As shown in FIG. 26(d), the electronic part 1 may be provided with the solder balls 9. The electronic part 1 is placed on the pads 8 of the ceramic substrate 3, and positioned so that the solder balls 9 coincide with the centers of the pads 8. FIG. 26(d) shows the solder balls 9 intentionally dislocated from the centers of the corresponding pads 8 to illustrate the self-alignment effect of the embodiment. Thus, the electronic part 1 is fixed temporarily to the ceramic substrate 3 by the viscosity and surface tension of the organic material 301, preventing the dislocation of the electronic part I relative to the ceramic substrate 3 due to vibrations during transportation before reflow soldering.

Figure 26E:
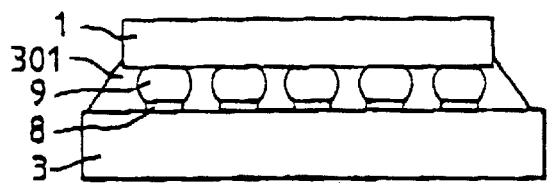

As shown in FIG. 26(e), the bonding portions are coated with the organic material 301 in a heating process for heating the solder balls 9, whereby the oxidation of the solder balls 9 is inhibited. For example, an organic material of the alcohol type reduces and removes the oxide coating the solder balls 9, enhances the wettability of the pads 8 to the solder balls 9, and enables quick self-alignment and satisfactory bonding.

Figure 26F:
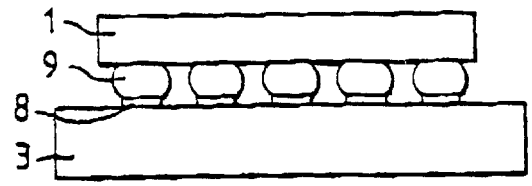

After bonding has been completed, the organic material 301 evaporates completely during a cooling process as shown in FIG. 26(f); hence, after-cleaning is unnecessary. Thus, a highly reliable electronic circuit device comprising the ceramic substrate 3 and the LSI chip bonded to the ceramic substrate 3 can be easily fabricated.

FIGS. 27(a)–27(g) and 28(a)–28(f) further illustrate the behavior of the solder balls when bonding an electronic part to a substrate by reflow soldering. The following explanation relates to the effect of temporarily fixing the electronic part to the substrate with an organic material, as discussed above, for preventing the dislocation of the electronic part relative to the substrate, shielding bonding portions from the atmosphere, facilitating self-alignment, and realizing highly reliable soldering.

The steps shown in FIGS. 27(a)–27(g) illustratively employ an organic material that has no hydroxyl group in the molecules other than those shown in Table 2. This method employs, for example, tridecane $CH_3(CH_2)_{11}CH_3$ (B.P.: 234° C.), 1-methylnaphthalene $CH_3C_{10}H_7$ (B.P.: 234° C.), or the like when reflow soldering is carried out in an Ar or $N_2$ atmosphere. Hexadecane $CH_3(CH_2)_{14}CH_3$ (B.P.: 287° C.) or the like is used when reflow soldering is carried out in an He atmosphere.

Figure 27A:
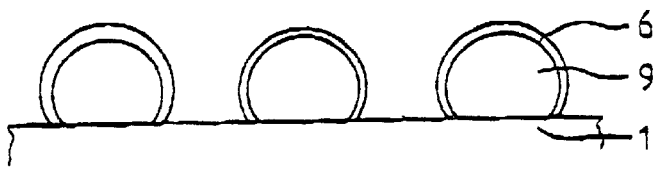
FIGS. 27(a)–27(g) are sectional views of a workpiece in different phases of an electronic circuit device fabricating method in which an organic material that has no hydroxyl group is employed for surface cleaning in accordance with the teachings of the present invention.
Figure 27B:
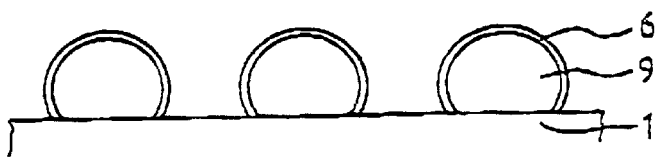

Referring now to FIG. 27(a), the surfaces of the solder balls 9 formed on the electronic part 1 are coated with an oxide film (or an organic contaminant film) 6. Since the solder has been melted to form the solder balls 9, the thickness of the oxide film 6 may be as large as several tens to several hundreds nanometers, and varies from portion to portion. Therefore, as shown in FIG. 27(b), the connecting surfaces are cleaned to reduce and even out the thicknesses of the oxide films 6 (or the organic contaminant films) coating the solder balls 9 of the electronic part 1 and pads 8 formed on the ceramic substrate 3 (FIG. 27(c)).

Figure 27C:
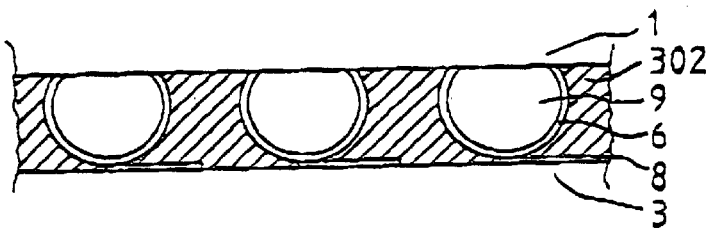

Then, as shown in FIG. 27(c), the electronic part 1 is positioned and mounted on the ceramic substrate 3, which has been coated with an organic material 302 having no hydroxyl group. The organic material 302 covers the bonding portions 8 and holds the electronic part 1 so that the electronic part 1 is not dislocated relative to the ceramic substrate 3 by vibrations that may occur during processes between the mounting and the heating for reflow soldering.

Figure 27D:
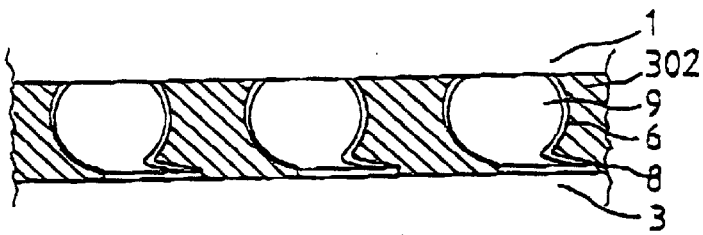
Figure 27E:
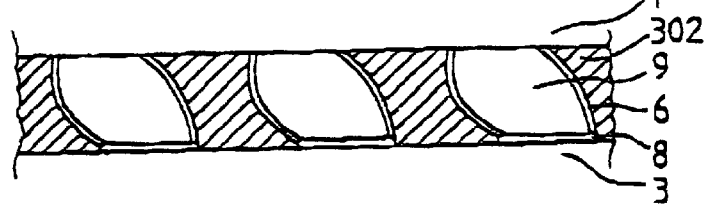

Then, as shown in FIG. 27(d), the solder balls 9 are melted in the heating process, and the molten solder spreads over the pads 8 of the ceramic substrate 3. The molten solder balls 9 self-align with the corresponding pads 8 as shown in FIG. 27(e).

Figure 27F:
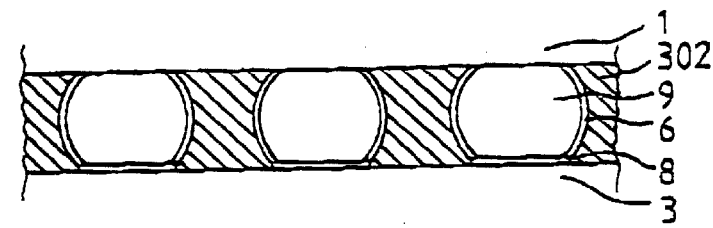
Figure 27G:
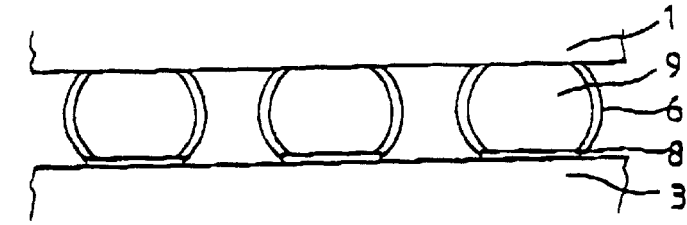

The organic material 302 covers the solder balls 9 and the pads 8 until the electronic part 1 is completely bonded to the ceramic substrate 3 as shown in FIG. 27(f), preventing the oxidation of the solder balls 9 and the pads 8, and promoting the spread of the solder by shielding the solder balls 9 and the pads 8 from the heating atmosphere. The organic material 302 evaporates during the heating process, leaving no residue as shown in FIG. 27(g). Therefore, cleaning is unnecessary after the electronic part 1 has been completely bonded to the ceramic substrate 3.

Figure 28A:
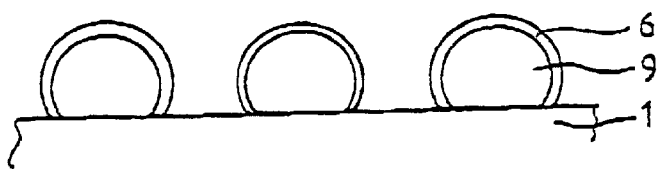
FIGS. 28(a)–28(f) are sectional views of a workpiece in different phases of an electronic circuit device fabricating method in which an organic material having hydroxyl groups is employed in a surface cleaning technique according to the present invention.
Figure 28B:
Figure 28C:
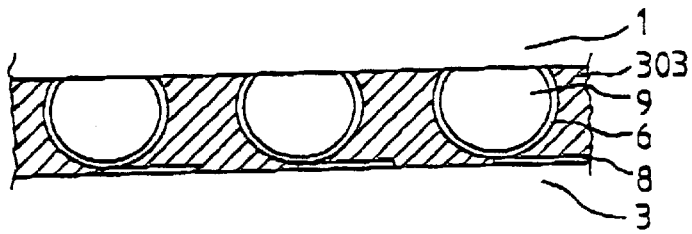
Figure 28D:
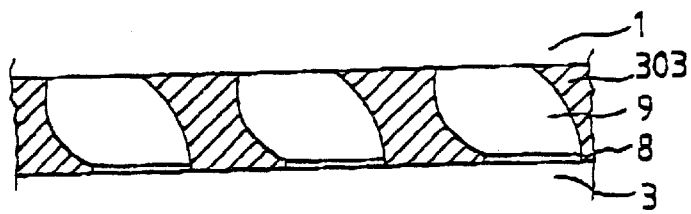
Figure 28E:
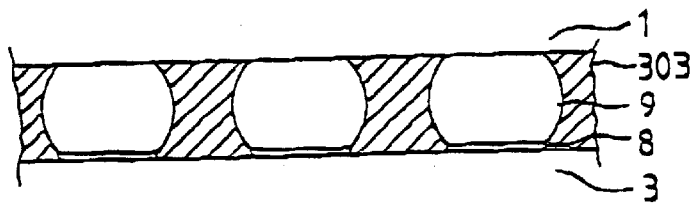

FIGS. 28(a)–28(f) illustrate a similar electronic circuit device fabricating method, but wherein the organic material has hydroxyl groups in the molecules. By comparison to the reflow soldering process shown in FIGS. 27(d) and 27(e), the steps shown in FIGS. 28(d) and 28(e) are capable of completely removing thin oxide films 6 remaining after the surface cleaning process by the reducing action of an organic material 3 having hydroxyl groups. The steps shown in FIGS. 28(a) and 28(b), similarly to those shown in FIGS. 27(a) and 27(b), reduce and even up the thicknesses of the oxide films (or organic contaminant films) 6 coating the solder balls 9 and the pads 8. The solder balls 9 and the pads 8 are covered with the organic material 303 having the hydroxyl groups, as shown in FIG. 28(c).

Figure 28F:
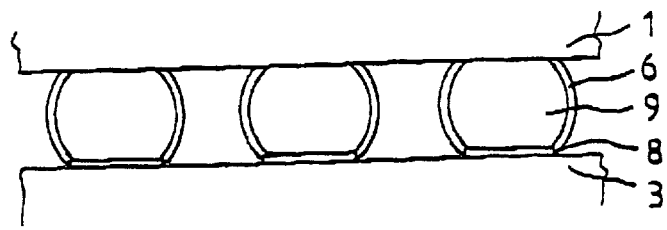

In the heating process (i.e., the reflow soldering process), the solder balls 9 and pads 8 are protected from oxidation, and the oxide films 6 are reduced and removed, as shown in FIGS. 28(d) and 28(e). Thus, this embodiment enhances the wettability of the pads 8 and facilitates the self-alignment of the solder balls 9 with the pads 8 more effectively, as compared with the method illustrated in FIGS. 27(a)–27(g). The organic material 303 evaporates completely, leaving no residue, as shown in FIG. 28(f); hence, a further cleaning process is unnecessary.

Figure 29A:
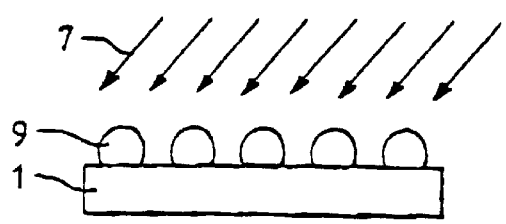
FIGS. 29(a)–29(f) are sectional views of a workpiece in different phases of an electronic circuit device fabricating method having a step of supplying an organic material to individual connecting terminals, wherein the connecting terminals are separated from each other.
Figure 29B:
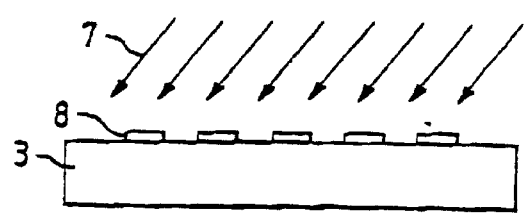

FIGS. 29(a)–29(f) illustrate another method embodying the present invention, that covers pads 8 and solder balls 9 individually and discontinuously. As shown in FIGS. 29(a) and 29(b), a cleaning process similar to the pretreatment process illustrated in FIGS. 26(a) and 26(b) is carried out to remove oxide films and organic contaminant films coating the solder balls 9 of the electronic part 1 and the pads 8 of the ceramic substrate 3. The resent embodiment applies a smaller quantity of organic material than that applied to the ceramic substrate 3 in the method illustrated in FIGS. 26(a)–26(f). Therefore, it is desirable to use an organic material having a boiling point higher than that of the organic material employed in the method of FIGS. 26(a)–26(f). 5 Preferred organic materials include, for example, triethylene glycol (B.P.: 285° C.), tetraethylene glycol (B.P.: 314° C.), and the like when reflow soldering is carried out in an Ar or $N_2$ atmosphere, or tetraethylene glycol (B.P.: 314° C.), pentaethylene glycol (B.P.: 370° C.), and the-like when reflow soldering is carried out in an He 10 atmosphere.

Figure 29C:
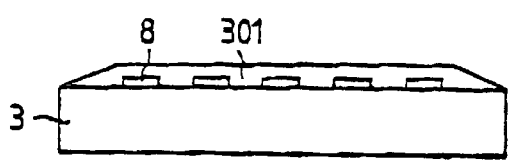
Figure 29D:
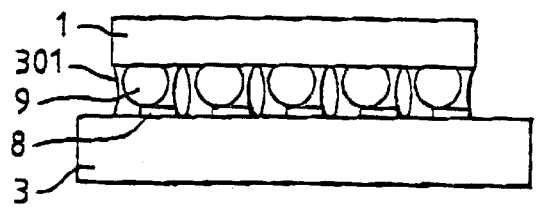
Figure 29E:
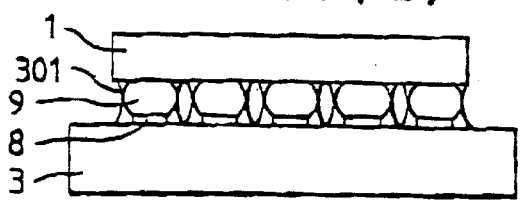
Figure 29F:
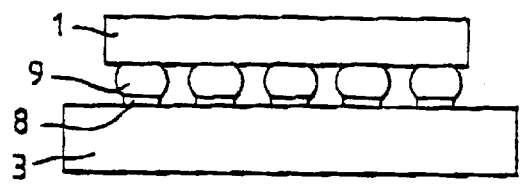

As shown in FIG. 29(c), a thinner layer of organic material 301 is applied to the ceramic substrate 3, so that the thickness of the organic material 301 is two-thirds the height of the solder balls 9, or less. Consequently, each combination of a solder ball 9 and a pad 8 is aligned and covered individually with the organic material 301 by the agency of the wettability and surface tension of the organic material 301 as shown in FIG. 29(e), even though the electronic part 1 is misaligned when initially mounted on the ceramic substrate 3 as shown in FIG. 29(d). The organic material 301, being of the alcohol type, prevents the oxidation of the solder balls 9 and reduces and removes the oxide films coating the solder balls 9, so that the solder balls 9 melt and spread satisfactorily, and so that the self-alignment of the solder balls 9 with the corresponding pads 8 can be achieved in a short time. In a subsequent cooling process, the organic material 301 evaporates completely without leaving any residue, as shown in FIG. 29(f); hence, no subsequent cleaning process is necessary.

Figure 30:
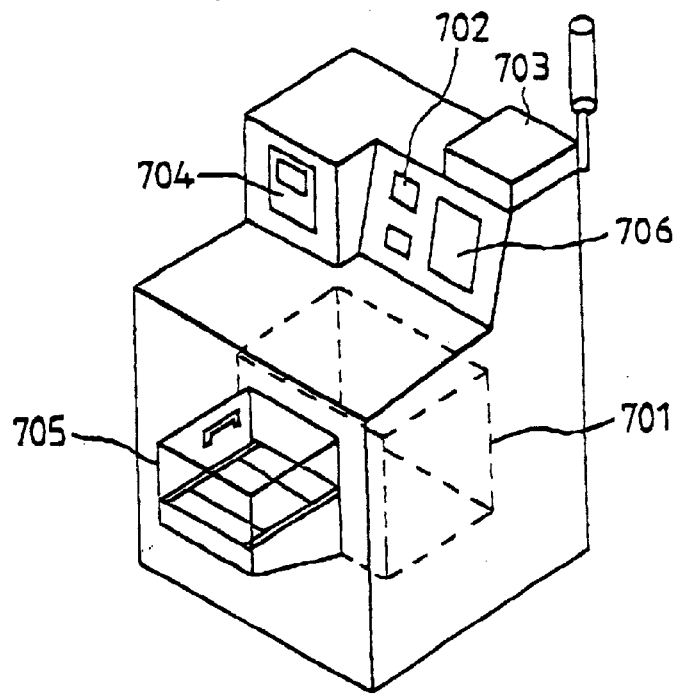
FIG. 30 is a perspective view of a heating device included in a preferred embodiment of the present invention.
Figure 31:
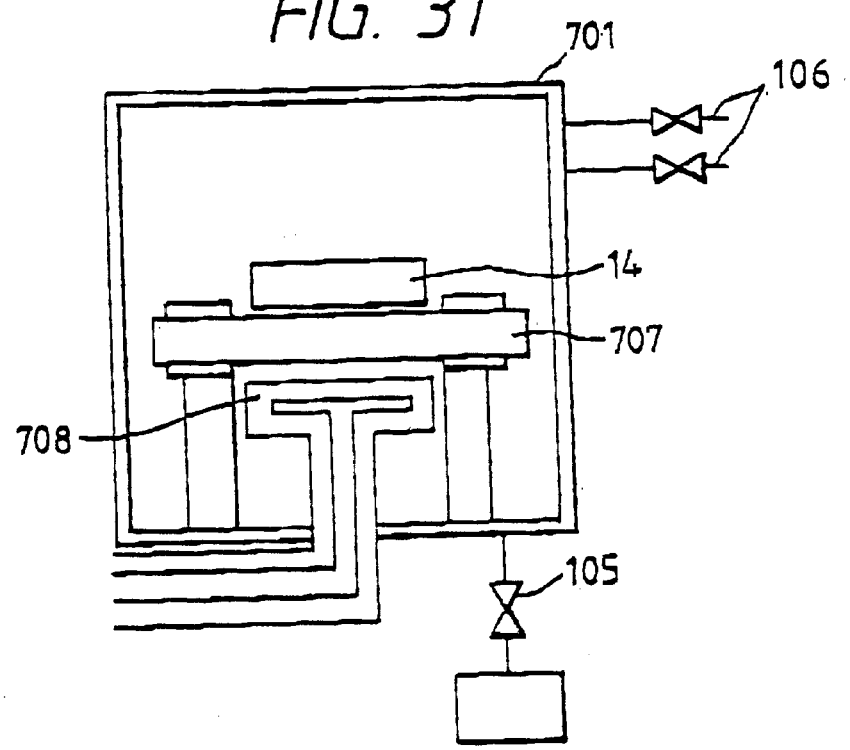
FIG. 31 is a schematic sectional view of a processing vessel disposed within a heating device according to a preferred embodiment of the present invention.
Figure 32A:
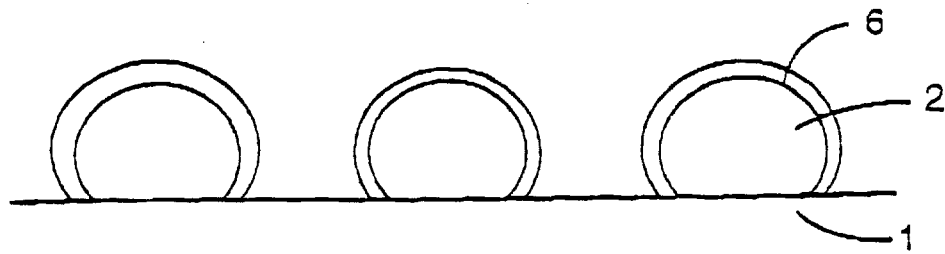
FIGS. 32(a)–32(d) illustrate steps for removing an oxide film from a solder ball using an organic-material heat-cleaning method according to the present invention.
Figure 32B:
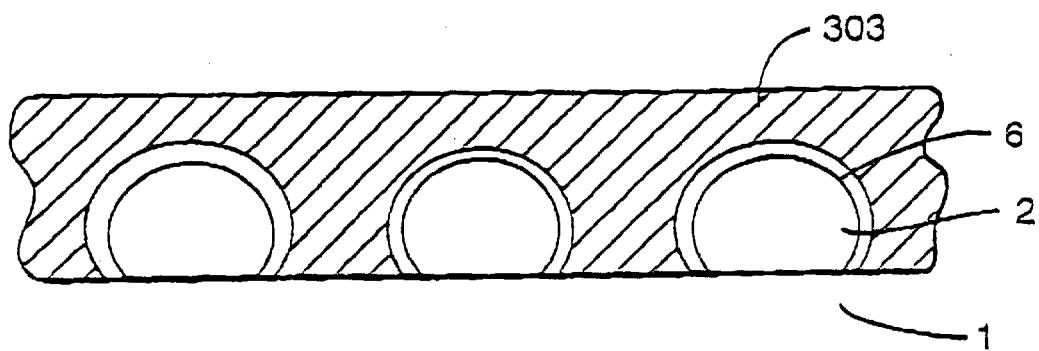
Figure 32C:
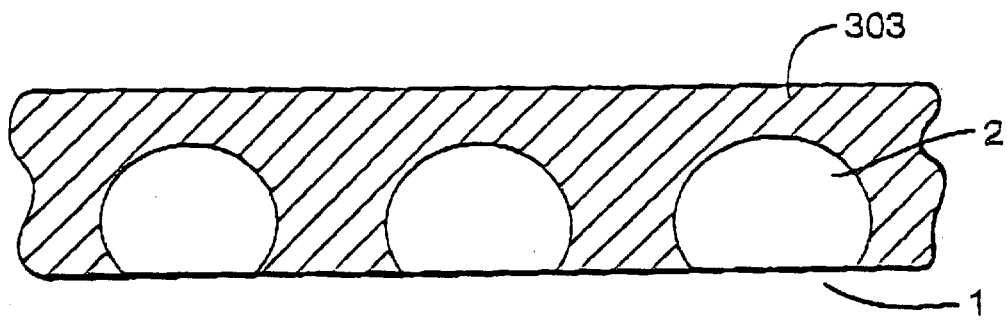
Figure 32D:
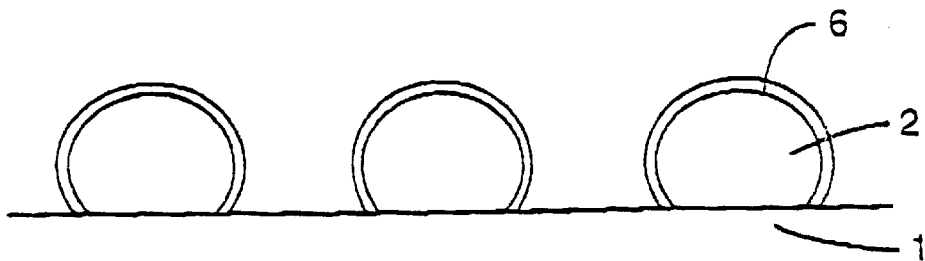

FIGS. 30 and 31 are a perspective view and a sectional view, respectively, of a heating device for use in the foregoing embodiments. With additional reference to FIGS. 26(d) and 29(d), a workpiece 14 is obtained by aligning and temporarily fastening together the electronic part 1 and the ceramic substrate 3 using the organic material 301. Then, the solder balls 9 of the electronic part 1 and pads 8 of the ceramic substrate 3 are bonded together by heating the workpiece 14 using the heating device shown in FIG. 30. The heating device comprises a vessel 701 in which the workpiece is subjected to heating and cooling to bond the solder balls to the pads 8; a pressure controller for controlling the evaporation rate of the organic material 301; an oxygen concentration monitoring unit 703 for monitoring the oxygen concentration in the atmosphere within the vessel 701; a temperature controller 704 for controlling a carbon heater 707 for heating the workpiece 14 and the solder balls 9; a conveying unit 705 for conveying the workpiece to carry out a series of processes automatically; and a controller 706 for generally controlling the automatic operations of the heating device.

As shown in FIG. 31, the carbon heater 707, a water-cooled metallic cooling plate 708 for cooling the hot carbon heater 707, and the workpiece 14 are disposed within the vessel 701. The workpiece 14 is mounted on the carbon heater 707 for processing. A gas supply system 106 and evacuating system 105 are connected to the vessel 701 to regulate the heating atmosphere in the vessel 701.

The workpiece 14 is placed in the conveying unit 705, and then a robot transfers the workpiece 14 from the conveying unit 705 onto the carbon heater 707, as shown in FIG. 31. Then, the evacuating system 105, which comprises a rotary pump or the like, evacuates the vessel 701, and the gas supply system 106 supplies a nonoxidizing gas such as He, $N_2$, or Ar gas, or a reducing gas, such as a mixture of $H_2$ gas and $N_2$ gas into the vessel 701 so that the gas pressure in the vessel 701 is equal to the atmospheric pressure.

In this state, the oxygen concentration monitoring unit 703 measures the oxygen concentration of the gas filling up the vessel, 701. If the oxygen concentration is not equal to or below a predetermined oxygen concentration (preferably 20 ppm or below), the evacuating operation and the gas supply operation are repeated.

After thus creating a heating atmosphere within the vessel 701, the workpiece 14 is heated by the carbon heater 707 by direct heat conduction while continuously monitoring the heating condition The temperature controller 704 controls the heating operation of the carbon heater 707 so that the solder balls 9 are heated at a temperature higher than their melting point. If the solder balls 9 are formed of $Sn_3Ag$ solder having a melting point of 221° C., the carbon heater 707 is set for 250° C.

Upon the start of heating, the liquid organic material for temporarily fixing the electronic part 1 to the ceramic substrate 3 starts to evaporate. When desirable, the pressure of the heating atmosphere is set to a negative pressure (a positive pressure) to promote (to suppress) the evaporation of the liquid organic material.

After the solder balls 9 have been melted and the bonding of the solder balls 9 to the pads 8 has been completed, cooling water is circulated through the water-cooled metallic cooling plate 708 to cool the hot carbon heater 707 and the workpiece 14. Then, the workpiece 14 is removed from the vessel 701 by the conveying unit 705. The liquid organic material is used for (1) temporary fixation, (2) oxidation prevention, and (3) reduction and removal of oxide.

The mode of covering the solder balls 9 and the pads 8 is determined according to the purpose of using the liquid organic material. When a liquid organic material having a boiling point below the melting point of the solder is used for the purpose of temporary fixation, the liquid organic material evaporates completely at a high evaporation rate during the reflow soldering process. When a liquid organic material is used for the purpose of coating the solder balls 9 and the pads 8 to prevent oxidation and reduce/remove the oxides, the solder balls 9 and the pads 8 must be kept coated with the organic material until the solder balls 9 are bonded completely to the pads 8. In this case, an organic material having a boiling point higher than the melting point of the solder may be used. However, such an organic material evaporates at a low evaporation rate, and there is a high possibility that the organic material does not evaporate completely during the reflow soldering process and remains on the workpiece.

This embodiment evacuates the vessel 701 in a vacuum to make the liquid organic material evaporate completely before the workpiece 14 is cooled by the cooling plate 708, so that subsequent cleaning can be omitted. The evaporation of the liquid organic material can be simply controlled by controlling the pressure of the heating atmosphere during the reflow soldering process.

FIGS. 32(*a*)–32(*d*) illustrate steps for removing the oxide film 6 from a solder ball 2 on a substrate 1 by organic material heat cleaning. A surface of a solder ball 2 on which a thick oxide film 6 is formed is shown in FIG. 32(*a*). Organic material 303 having a hydroxyl group is supplied over the solder ball 2 as shown in FIG. 32(*b*). Then, the thick oxide film 6 is removed by heating (FIG. 32(*c*)). The organic material 303 has an agency to reduce and remove an oxide film. Then, the organic material is vaporized (FIG. 32(*d*)). Therefore, the organic material 303 has the ability to clean an oxide film like a sputter cleaning method using atoms or ions, a mechanical cleaning method, or a laser cleaning method.

In summary, the present invention removes by sputter-cleaning the oxide/contaminant films coating the solder balls and pads of members to be joined together, and joins the members together in the atmosphere so that the solder balls are aligned with the corresponding pads. Therefore, the positioning apparatus need not be installed in a vacuum.

Further, since the reflow soldering process can be carried out by using a general purpose belt furnace, the ease of processing and the productivity can be enhanced. Since the oxide/contaminant films coating the solder balls and the pads can be removed by mechanical cleaning, the sputter cleaning apparatus may be omitted or the duration of sputter cleaning may be curtailed, to enhance the efficiency of the bonding process. Since the oxide/contaminant films coating the solder balls and the pads can be removed with a laser beam in any one of the atmosphere, a vacuum, or a helium atmosphere, an existing apparatus having such an atmosphere can be employed in carrying out the electronic circuit device fabricating method.

The solder balls may be Au-plated to omit the sputter cleaning process or the mechanical cleaning process, which enhances the ease of work and the productivity. Since the solder balls formed by an atomizing process or an oil tank process are subjected to a reducing process using a weak acid solution to remove the oxide/contaminant films coating the solder balls, and then the solder balls are Au-plated, the Au-plated solder balls have an excellent bonding property.

The projections and recesses formed on the members to be joined together facilitate the alignment of the members, and prevent the dislocation of those members relative to each other due to vibrations during transportation. Further, since an organic material is applied to the pads to temporarily fix the electronic parts on a circuit substrate, the dislocation of the members is prevented.

Since the workpiece prepared by combining the members to be joined together is placed in the receiving chamber, the receiving chamber is evacuated to remove adsorbed detrimental gases, and then the workpiece is heated in a nonoxidizing atmosphere or a reducing atmosphere, the surface of the solder balls are not oxidized before melting and highly reliable fluxless soldering can be achieved. Since the solder balls and the pads are covered with the liquid organic material for temporarily fixing together the members to be joined to prevent the oxidation of the solder balls and the pads or to reduce and remove the oxide films coating the solder balls and the pads, stable, highly reliable bonding can be achieved.

Optimum soldering conditions can be established by controlling the concentration of the nonoxidizing or the reducing gas in the heating and melting means. The spreadability of the solder is improved through the prevention of oxidation, and the liquid organic material can be completely evaporated by controlling the pressure of the atmosphere in the heating and melting means, to control the evaporation of the liquid organic material. The efficiency of the electronic circuit device fabricating apparatus can be enhanced by using the belt conveyor for conveying the members to be joined together.

While the present invention has been particularly shown and described with reference to preferred embodiments thereof, it will be understood by those skilled in the art that the foregoing and other modifications in form and detail may be made without departing from the spirit and scope of the present invention.

The principle of the present invention will be specifically described making reference to the flow chart in FIGS. 33(*a*)–33(*e*) as a typical example. As shown in FIG. 33(*a*), on an aligning jig 332 in which holes or concaves have been formed 80 that solder balls 331 to be applied can be fitted thereto, correspondingly to the electrodes to which the solder is to be applied, the solder balls 331 are laid out by vacuum suction or the like while vibrating the aligning jig 332. Next, as shown in FIG. 33(*b*), on an electronic part or circuit board 333 to which the solder is to be applied, a liquid 334 capable of vaporizing up after the bonding is completed in the heat-melting step is coated by, e.g., spraying, squeezing or using a dispenser to such an extent that the surfaces of electrodes 333*a* and the solder balls 331 at their portions coming into contact with the electrodes 333*a* at the time of heat-melting are covered. Then, as shown in FIG. 33(*c*), the aligning jig 332 to which the solder balls 331 have been fitted is turned upside down while the solder balls are held by vacuum suction, and the solder balls 331 are mounted on the electrodes 333*a* after the former's registration to the latter.

Thereafter, heating is started, so that the liquid 334 comes to have the melting temperature of the solder while gradually vaporizing as shown in FIG. 33(*d*). At this stage, surface oxide films are broken as a result of volumetric expansion caused by melting of the solder balls. Meanwhile, the surfaces of electrodes 333*a* are still covered with the liquid 334, and hence they are isolated from oxygen in the surrounding air not to undergo reoxidation. Accordingly, fresh surfaces of molten solder balls 331 come into contact with the surfaces of electrodes 333*a*, and the solder is wetly spread over the electrode surfaces. Thereafter, as shown in FIG. 33(e), the vacuum suction is released before the solder solidifies, and the aligning jig 332 is put apart from the solder balls 331. Thus, an electronic circuit device can be obtained in which uniformly good and spherical solder balls are formed without any deformation of solder balls which may be caused by the jig 332.

An alcohol type liquid may also be used as a liquid 334 having a boiling point that is not lower than the melting point of the solder and not higher than a peak temperature at the time of heat-melting. Such a liquid also has the action to reduce the initial surface oxide films of the solder balls 331 and electrodes 333a, and hence the surface oxide films can be made thinner, so that the surface oxide films can be readily broken at the time of melting of the solder and the solder can be readily wetly spread over the electrodes 333a.

Figure 33A:
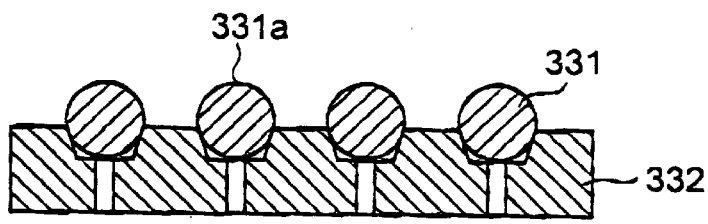
FIGS. 33(a)–33(e) is a cross-sectional view showing steps used in the process for manufacturing an electronic circuit device, which illustrates the principle, and also a first example, of the present invention.
Figure 33B:
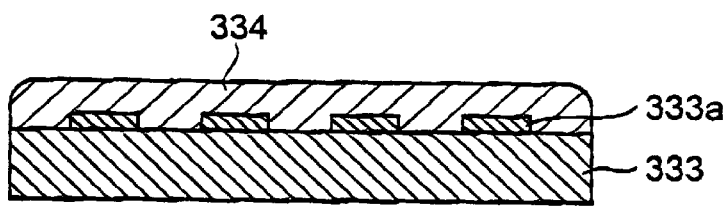
Figure 33C:
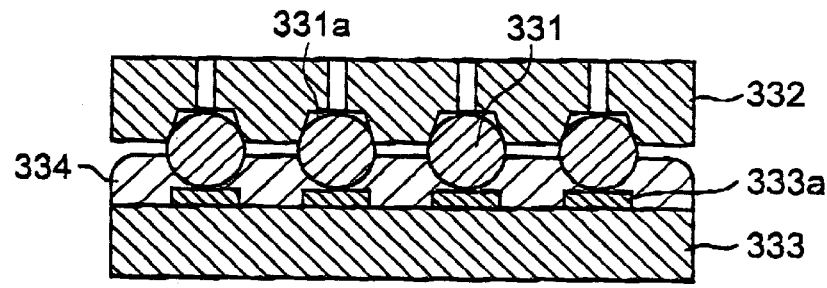
Figure 33D:
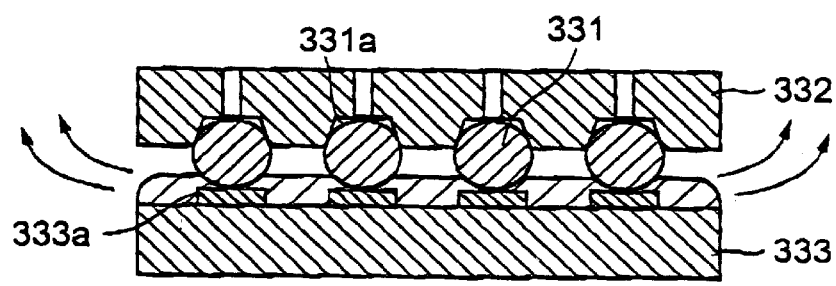
Figure 33E:
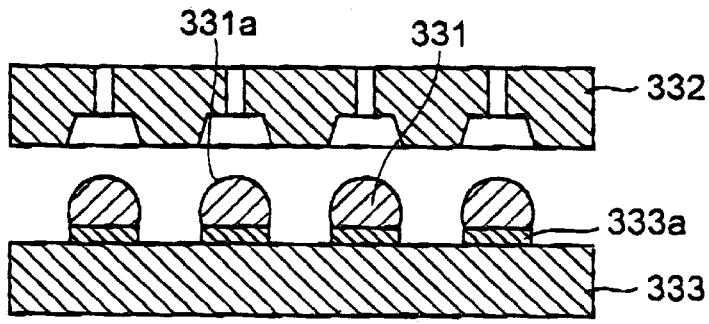
Figure 34A:
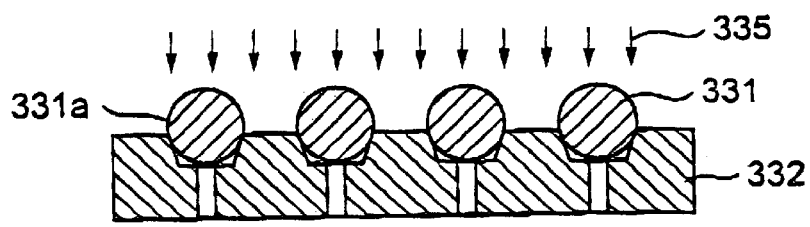
FIGS. 34(a)–34(e) is a cross-sectional view showing steps used in the process for manufacturing an electronic circuit device, which similarly illustrates a second example of the present invention.
Figure 34B:
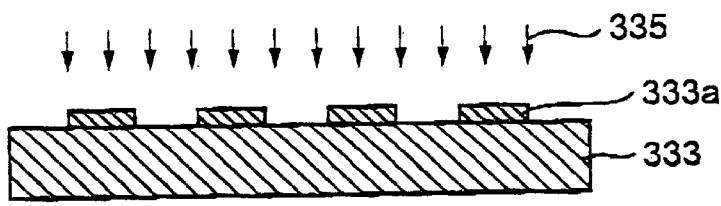
Figure 34C:
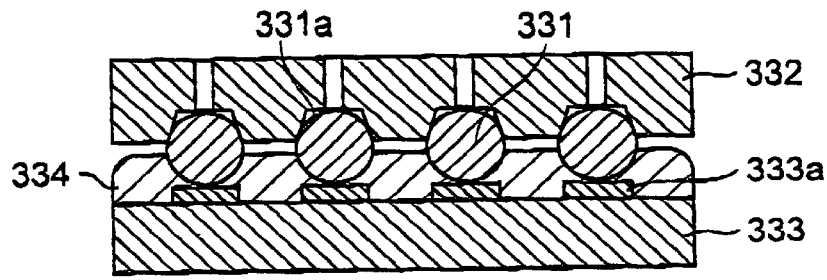
Figure 34D:
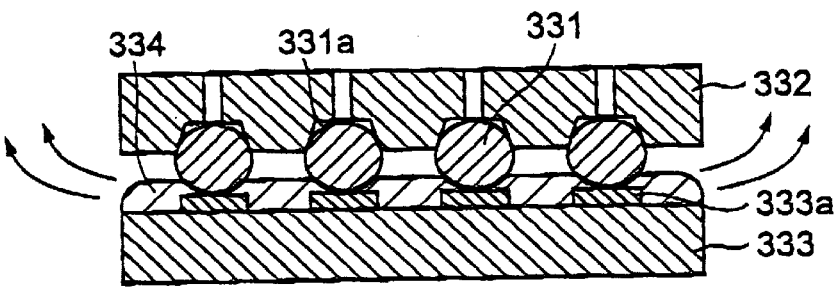
Figure 34E:
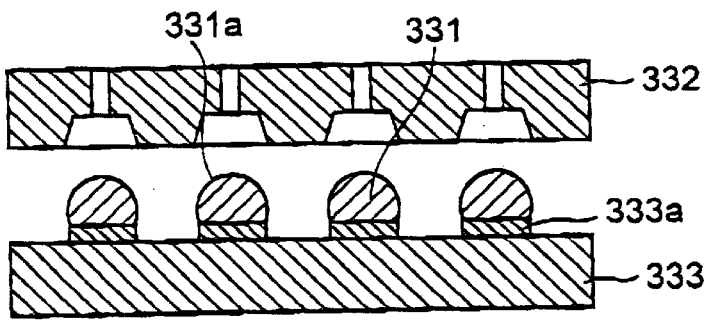

As another example, as shown in FIGS. 34(a) and 34(b), after the solder balls 331 are fitted to the aligning jig 332, the surfaces of solder balls 331 and the surfaced of electrodes 333a are subjected to sputter etching or plasma beam or laser beam treatment to remove the initial surface oxide films on the surfaces. Thereafter, as shown in FIG. 34(c) to 34(e), the procedure as shown in FIGS. 33(a) to 33(e) is repeated to coat the liquid to prevent reoxidation, followed by registration, mounting and heat-melting. Thus, it becomes possible to establish a process of well applying the solder.

Figure 35A:
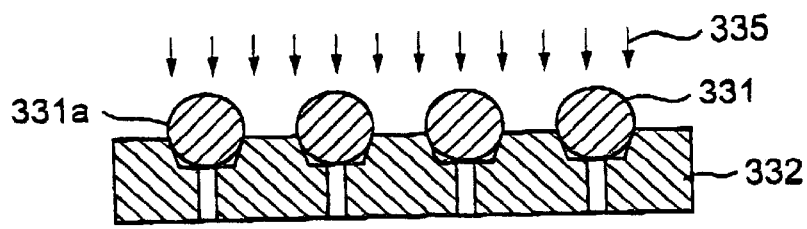
FIGS. 35(a)–35(e) is a cross-sectional view showing steps used in the process for manufacturing an electronic circuit device, which similarly illustrates a third example of the present invention.
Figure 35B:
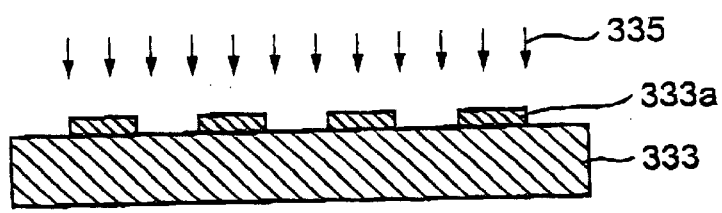
Figure 35C:
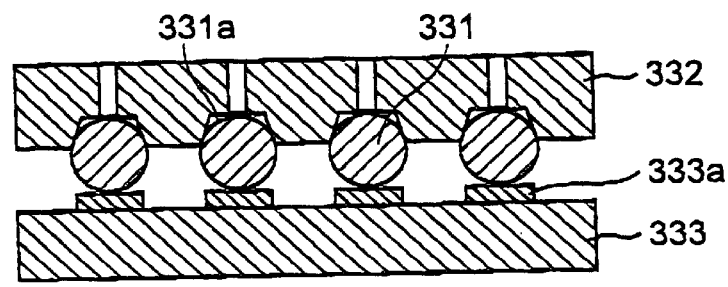
Figure 35D:
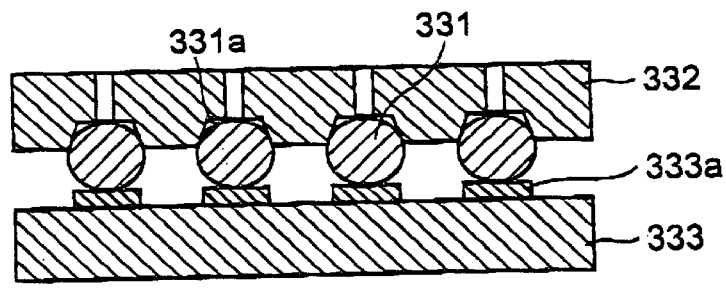
Figure 35E:
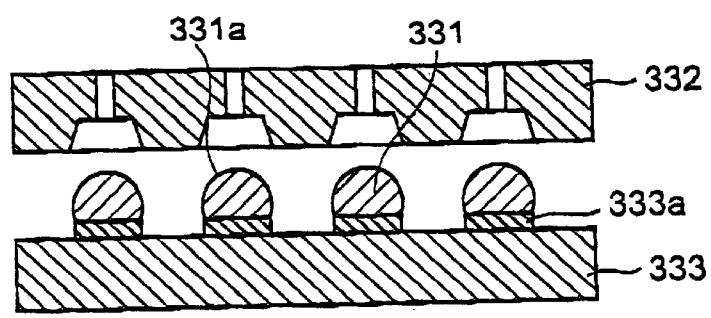

As also shown in FIG. 35(a) and 35(b), after the initial surface oxide films are removed from the surfaces of solder balls 331 and the surfaces of electrodes 333a, the solder balls are registered to and mounted on the electrodes without applying the liquid, as shown in FIG. 35(c). Then, as shown in FIG. 35(d), the solder is heat-melted in a non-oxidizing atmosphere, e.g., in an atmosphere of helium, argon, nitrogen, hydrogen or a mixed gas of any of these. Thus, the surfaces of the solder balls 331 and electrodes 333a can be prevented from reoxidation, and hence, as shown in FIG. 35(e), the solder can be applied without coating any liquid.

Examples of the present invention will be described below in detail with reference to the drawings.

EXAMPLE 1

FIGS. 33(a)–33(e) cross-sectionally illustrate a process of applying solder balls to the electrodes on a printed circuit board, using the process for manufacturing an electronic circuit device according to the present invention. The process will be detailed below in the order of steps. First, as shown in FIG. 33(a), on the aligning jig 332 made of, e.g., glass and in which holes have been formed correspondingly to the electrodes 333a to which the solder is to be applied, solder balls 331 composed of, e.g., an eutectic of Sn and Pb (melting point: 183° C.) are laid out by vacuum suction or the like while vibrating the aligning jig. Meanwhile, as shown in FIG. 33(b), on the electrodes 333a of a printed circuit board 333 to which the solder is to be applied, a liquid 334 capable of vaporizing in the heat-melting step, e.g., ethylene glycol (boiling point: 198° C.) is coated by spraying or the like in a stated quantity, i.e., in such a quantity that it remains in a quantity necessary only for covering the solder ball and electrode surfaces, when the solder melts. Next, as shown in FIG. 33(c), the aligning jig 332 is turned upside down while the solder balls 331 are held thereon by vacuum suction, and the solder balls 331 are mounted on the electrodes 333a with registration of the solder balls 331 to their corresponding electrodes 333a.

Thereafter, as shown in FIG. 33(d), heat-melting is carried out at temperatures up to about 220° C. Here, an alcohol type liquid such as ethylene glycol is used as the liquid 334. Since it has a reducing action, the initial surface oxide films 331a on the solder ball surfaces are removed. Also, since the surfaces of electrodes 333a are covered with the liquid 334 until the solder balls 331 melt and the bonding is completed, they undergo no reoxidation. Such removal of initial surface oxide films and prevention of reoxidation enable the solder to be wetly spread on over the electrode surfaces when the solder balls 331 melt. Then, as shown in FIG. 33(e), the aligning jig 332 is detached from the solder balls 331. Thus, an electronic circuit device can be obtained in which the solder has been fluxlessly-applied to the electrodes 333a on the printed circuit board 333. Accordingly, it becomes unnecessary to provide any cleaning steps of removing flux residues and of removing fluxes adhering to the aligning jig 332, which are required in the conventional solder application making use of fluxes. Incidentally, the aligning jig may preferably be detached in the course of melting of the solder balls 331 so that the solder balls 331 do not deform

EXAMPLE 2

FIGS. 34(a)–34(e) cross-sectionally illustrate a process of applying solder, which additionally has, before the registration and mounting of solder balls, the step of removing the initial surface oxide films and organic contaminant films from the surfaces of solder balls 331 and the surfaces of electrodes 333a formed on the printed circuit board 333.

As shown in FIG. 34(a), solder balls 331 composed of, e.g., Au-20 wt. % Sn (melting point: 280° C.), which is an eutectic solder of Au and Sn, are laid out on the aligning jig 332 having holes correspondingly to the electrodes 333a, in the same manner as that shown in FIG. 33(a), and thereafter the initial surface oxide films on the solder ball surfaces are removed by, e.g., Ar sputter etching. Similarly, as shown in FIG. 34(b), the surfaces of electrodes 333a on the printed circuit board 333 are subjected to Ar sputter etching to remove initial surface oxide films and organic contaminant films therefrom.

Thereafter, as shown in FIG. 34(c), a liquid 334 capable of vaporizing in the heat-melting step, e.g., tetraethylene glycol (boiling point: 314° C.) is coated on the printed circuit board 333, where the aligning jig 332 to which the solder balls 331 have been fitted as shown in FIG. 34(a), is turned upside down, and the solder balls are mounted on their corresponding electrodes 333a with former's registration to the latter. Thereafter, as shown in FIG. 34(d), heat-melting is carried out at temperatures up to about 310° C. Here, the initial surface oxide films have been removed before the solder balls are mounted. Hence, even though the liquid has no reducing action, very thin oxide films on the solder balls break as a result of volumetric expansion of solder when the solder balls melt, thus the solder is wetly spread over the surfaces of electrodes 333a, so that, as shown in FIG. 34(e), the solder is fluxlessly-applied to the electrodes 333a.

EXAMPLE 3

FIGS. 35(a)–35(e) cross-sectionally illustrate a process of applying solder without using the above liquid after the step of removing the surface oxide films in the same manner as the process shown in FIGS. 34(a)–34(e).

First, as shown in FIG. 35(a), solder balls 331 composed of, e.g., Sn-3.5 wt. % Ag (melting point: 223° C.), which is an eutectic solder of Sn and Ag, are laid out on the aligning jig 332 having holes correspondingly to the electrodes 333a, in the same manner as that shown in FIG. 34(a), and thereafter the initial surface oxide films on the solder ball surfaces are removed by, e.g. plasma cleaning. Similarly, as shown in FIG. 35(b), the surfaces of electrodes 333a on the printed circuit board 333 are subjected to plasma cleaning to remove initial surface oxide films and organic contaminant films therefrom.

Then, as shown in FIG. 35(c), the aligning jig 332 to which the solder balls 331 have been fitted as shown in FIG. 35(a), is turned upside down, and the solder balls are mounted on their corresponding electrodes 333a with former's registration to the latter. Thereafter, as shown in FIG. 35(d), heat-melting is carried out in a non-oxidizing atmosphere, e.g., in an atmosphere of $N_2$ (oxygen concentration: about 10 ppm). The heating is carried out at a peak temperature of, e.g., 250° C. Thus, the surface initial surface oxide films are removed and the reoxidation is prevented in the non-oxidizing atmosphere. Accordingly, thin oxide films of few nm or so on the solder balls break when the solder balls melt, and the solder is wetly spread over the surfaces of electrodes 333a, so that, as shown in FIG. 35(e), the solder is applied to the electrodes 333a on the printed circuit board 333 without using any flux.

EXAMPLE 4

Figure 36A:
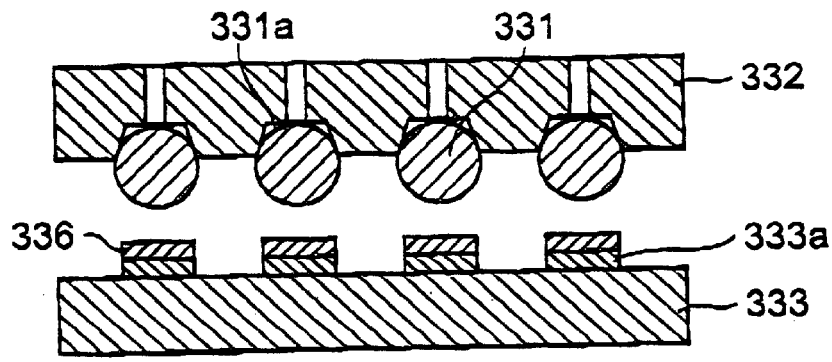
FIGS. 36(a)–36(c) is a cross-sectional view showing steps used in the process for manufacturing an electronic circuit device, which similarly illustrates a fourth example of the present invention.
Figure 36B:
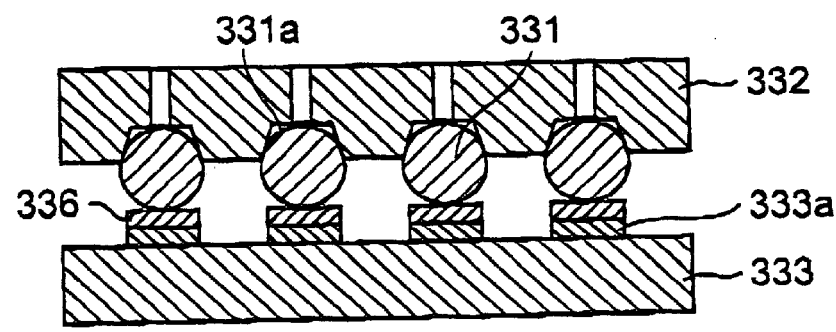
Figure 36C:
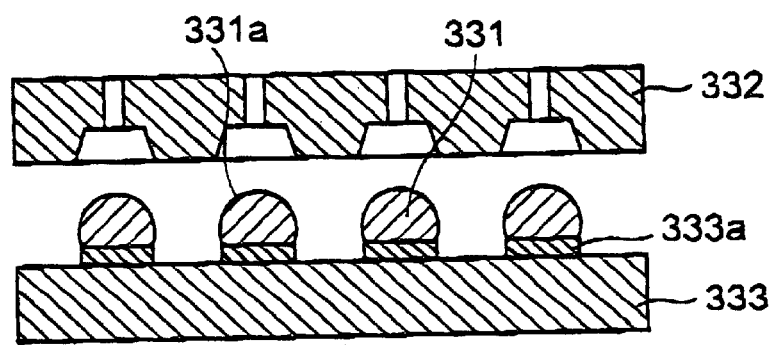

FIGS. 36(a)–36(c) cross-sectionally illustrate a process of applying solder in the present invention, without using the liquid used in Examples shown in FIGS. 33(a)–33(e) and 34(a)–34(e) and the step of removing the surface oxide films in Examples shown in FIGS. 34(a)–34(e) and 35(a)–35(c).

First, as shown in FIG. 36(a), solder balls 331 composed of, e.g., Sn-3.5 wt. % Ag and whose initial surface oxide films are retained in a thickness of about 5 nm or less are laid out on the aligning jig 332 having holes correspondingly to the electrodes 333a, in the same manner as that shown in FIG. 33(a). Meanwhile, the surfaces of electrodes 333a on the printed circuit board 333 are plated with Sn or the like in a thickness of, e.g., about 1 to 20 $\mu$m to form electrode protective films 336. Then, as shown in FIG. 36(b), the aligning jig 332 to which the solder balls 331 have been fitted is turned upside down, and the solder balls are mounted on their corresponding electrodes 333a with former's registration to the latter. Then, heat-melting is carried out at temperatures up to about 250° C. in a non-oxidizing atmosphere, e.g., in an atmosphere of He (oxygen concentration: 10 ppm). Since originally the oxide films on the solder ball surfaces have been controlled to be few nm thick or so and the reoxidation has been prevented in the non-oxidizing atmosphere, the solder of the solder balls 331 having melted, whose thin oxide films have broken as a result of volumetric expansion, is wetly spread on over the surfaces of electrodes 333a, so that, as shown in FIG. 36(c), the solder is fluxlessly-applied.

EXAMPLE 5

Figure 37A:
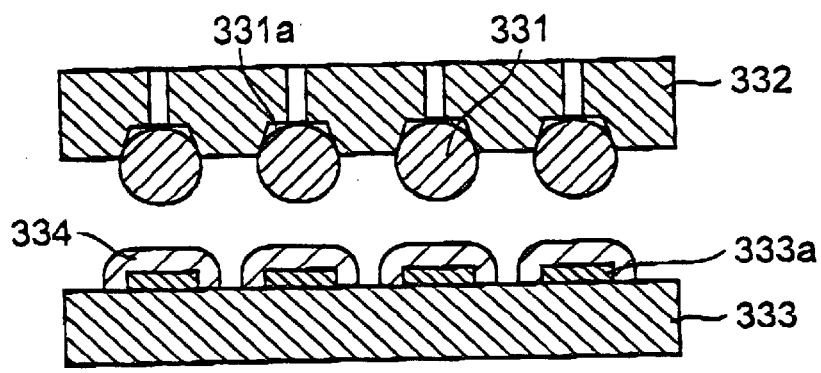
FIGS. 37(a)–37(c) is a cross-sectional view showing steps used in the process for manufacturing an electronic circuit device, which similarly illustrates a fifth example of the present invention.
Figure 37B:
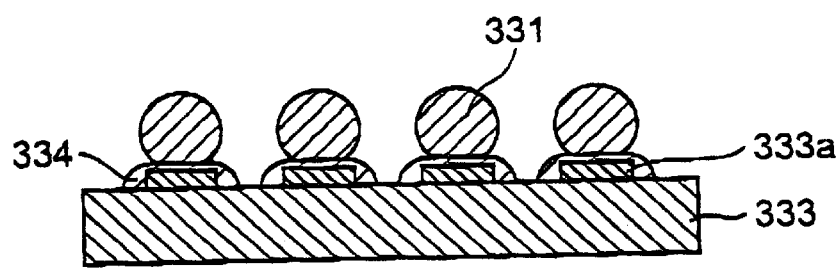
Figure 37C:
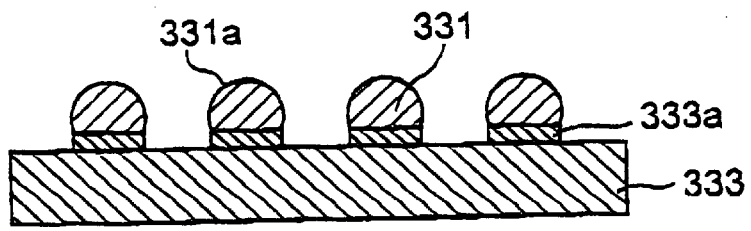

FIGS. 37(a)–37(c) cross-sectionally illustrate a process of applying solder by coating for each electrode a liquid 334 capable of vaporizing up after the bonding is completed in the heat-melting step.

As shown in FIG. 37(a), solder balls 331 composed of, e.g., Au-20 wt. % Sn are laid out on the aligning jig 332 having holes correspondingly to the electrodes 333a, in the same manner as that shown in FIG. 33(a). Thereafter, the aligning jig is turned upside down while keeping the vacuum auction. Also, the liquid 334 capable of vaporizing up after the bonding is completed in the heat-melting step is coated on the electrodes 333a formed on the printed circuit board 333, which is coated for each electrode 333a by, e.g., metal-mask printing. Then, the solder balls 331 are mounted on their corresponding electrodes 333a with former's registration to the latter. Thereafter, the vacuum suction is released to detach the aligning jig 332. The solder balls 331 thus mounted are, as shown in FIG. 37(b), provisionally fastened with the liquid 334 coated for each electrode 333a, without requiring their holding with the aligning jig 332. Then, heat-melting is carried out, so that, as shown in FIG. 37(c), the solder is fluxlessly-applied onto the electrodes 333a.

EXAMPLE 6

Figure 38A:
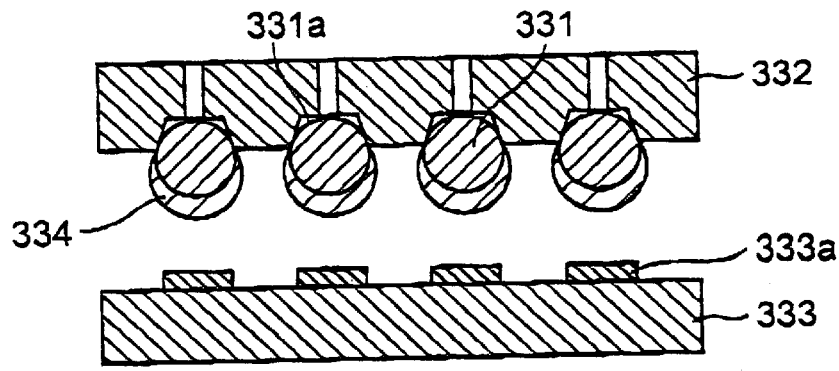
FIGS. 38(a)–38(c) is a cross-sectional view showing steps used in the process for manufacturing an electronic circuit device, which similarly illustrates a sixth example of the present invention.
Figure 38B:
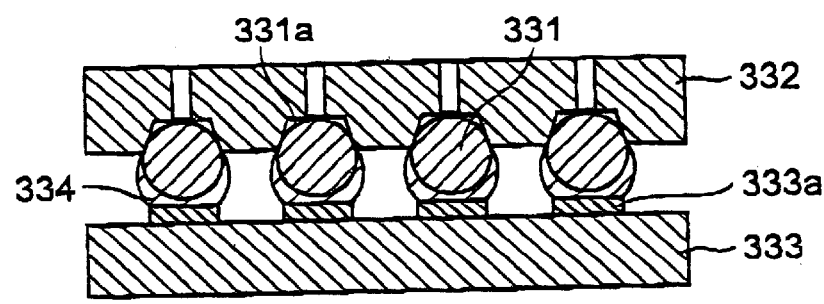
Figure 38C:
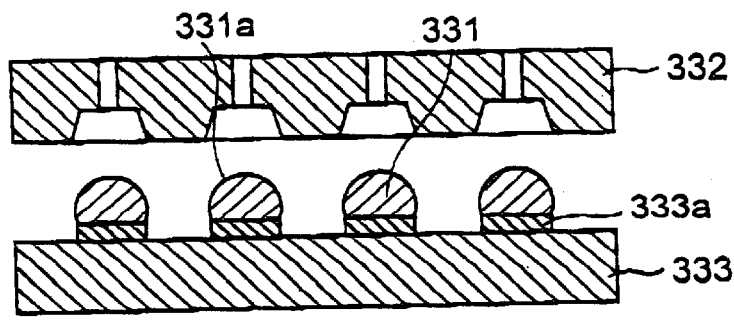

FIGS. 38(a)–38(c) cross-sectionally illustrate a process in which a liquid 334 capable of vaporizing up after the bonding is completed in the heat-melting step is applied on the side of solder balls 331.

First, solder balls 331 composed of, e.g., Sn-3.5 wt. % are laid out on the aligning jig 332 having holes correspondingly to the electrodes 333a, in the same manner as that shown in FIG. 33(a). Thereafter, the aligning jig is turned upside down while keeping the vacuum suction. Then, the aligning jig 332 to which the solder balls 331 have been fitted is immersed in the liquid 334 capable of vaporizing up after the bonding is completed in the heat-melting step, thus the liquid 334 is coated on the solder balls 331 as shown in FIG. 38(a).

Next, as shown in FIG. 38(b), the solder balls 331 are mounted on their corresponding electrodes 333a with former's registration to the latter, so that the solder balls and electrode surfaces are covered with the liquid 334. This prevents the reoxidation, where the heat-melting is carried out, so that, as shown in FIG. 38(c), the solder balls 331 is fluxlessly-applied to the electrodes 333a.

EXAMPLE 7

Figure 39A:
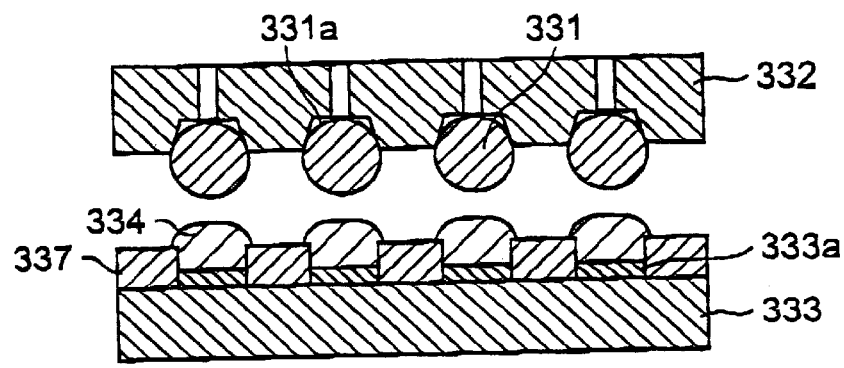
FIGS. 39(a)–39(c) is a cross-sectional view showing steps used in the process for manufacturing an electronic circuit device, which similarly illustrates a seventh example of the present invention.
Figure 39B:
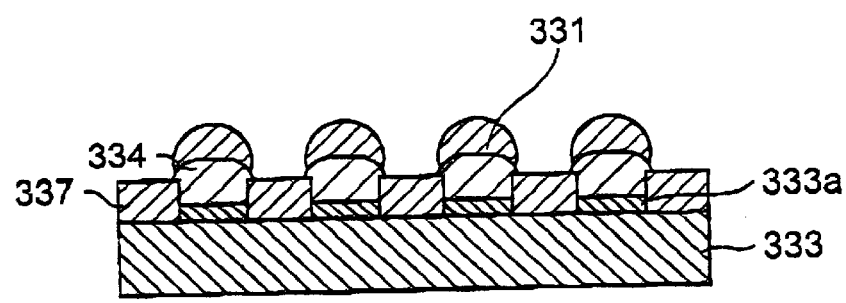
Figure 39C:
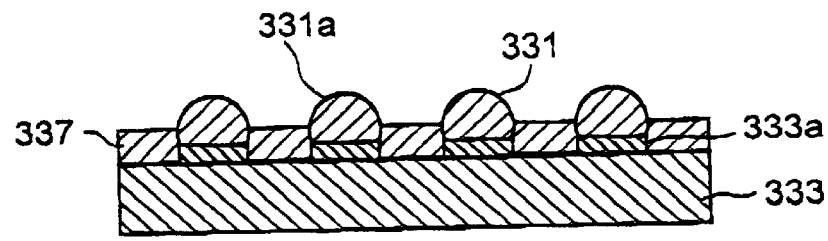

FIGS. 39(a)–39(c) cross-sectionally illustrate a process of applying solder to electrodes in the present invention without holding the solder balls by means of the aligning jig or provisionally fastening them with utilization of surface tension of the liquid.

First, as shown in FIG. 39(a), solder balls 331 composed of, e.g., an eutectic of Sn and Pb (melting point: 183° C.) are laid out on the aligning jig 332 in the same manner as that shown in FIG. 36(a), which is then turned upside down. Meanwhile, on a printed circuit board 333, the board surface other than electrodes 333a is coated with a resist 337 in order to protect the wiring from oxidation or corrosion. The resist is formed in a thickness necessary only for making the solder balls 331 not come off the electrodes 333a because of vibration or the like when mounted thereon. Then, as shown in FIG. 39(a), on the electrodes 333a of a printed circuit board 333 to which the solder is to be applied, a liquid 334 capable of vaporizing in the heat-melting step, e.g., benzyl alcohol (boiling point: 206° C.) is coated using a dispenser or the like in such a quantity that it remains in a quantity necessary only for covering the solder ball and electrode surfaces, when the solder melts. Then, the aligning jig 332 to which the solder balls 331 have been fitted is turned upside down, the solder balls are mounted on their corresponding electrodes 333a with former's registration to the latter, and the aligning jig 332 is put apart from the solder balls 331.

Thus, as shown in FIG. 39(b), the solder balls can be prevented from coming off without holding them by means of the aligning jig or provisionally fastening them with utilization of surface tension of the liquid 334. Then, heat-melting is carried out at temperatures up to about 220° C. Thus, as shown in FIG. 39(c), on account of the action to remove the initial surface oxide films that is attributable to the reducing action of benzyl alcohol and on account of the reoxidation preventive effect, the solder is wetly spread over the surfaces of electrodes 333a and also the liquid 334 vaporizes, so that the solder is fluxlessly-applied.

EXAMPLE 8

Figure 40A:
FIGS. 40(a)–40(c) is a cross-sectional view showing steps used in the process for manufacturing an electronic circuit device, which similarly illustrates a ninth example of the present invention in which the anisotropic conductive film is used.
Figure 40B:
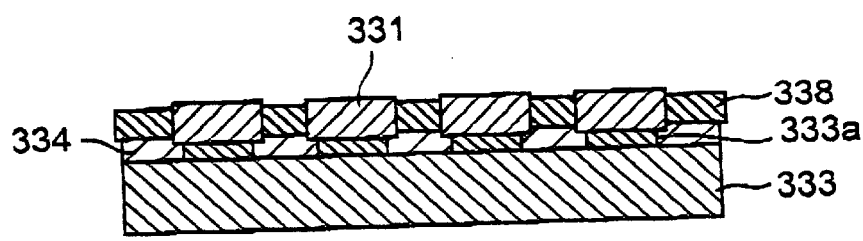
Figure 40C:
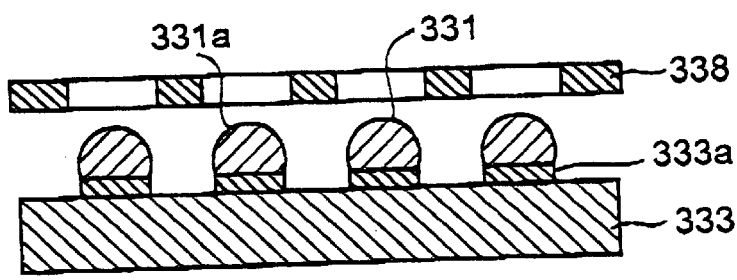

FIGS. 40(a)–40(c) cross-sectionally illustrate a process of applying solder in the present invention by using in combination the liquid capable of vaporizing in the heat-melting step and an anisotropic conductive film.

First, as shown in FIG. 40(a), an anisotropic conductive film 338 in which solder 331 composed of, e.g., an eutectic of Sn and Pb (melting point: 183° C.) has been formed only in a necessary quantity correspondingly to the pitch of electrodes 333a to which the solder is to be applied is, as shown in FIG. 40(b), brought into closed contact with the surface of a printed circuit board 333 on which a liquid 334 capable of vaporizing in the heat-melting step, e.g., trimethylene glycol (boiling point: 214° C.) has been coated; the both being done with registration of the former's pitch to the latter's electrodes.

Then, heat-melting is carried out at temperatures up to about 220° C. Thus, on account of the action to remove the initial surface oxide films that is attributable to the reducing action of trimethylene glycol and on account of the reoxidation preventive effect, the molten solder is wetly spread over the electrodes 333a, where the film 338 is detached, so that, as shown in FIG. 40(c), the solder is applied onto the circuit board 333. Incidentally, in order to prevent deformation of the solder applied, the diameter of each solder circle formed in the anisotropic conductive film 338 may preferably be kept larger than the diameter of each solder bump 331 finally formed on the electrode, to such an extent that the solder adjacent to each other may not become bridged.

EXAMPLE 9

Conditions necessary for the liquid having been described above will be briefly described.

FIG. 41 shows the results of evaluation made on bonding performance (wettability, self-alignment, and formation of residues) attributable to alcohols, hydrocarbons, esters, ketones, aldehydes or ethers which are used as the liquid for provisional fastening in the present invention.

First, with regard to the wettability, alcohols, hydrocarbons and esters show good results. The wettability refers to the degree of how well the solder is wetly spread over the whole electrodes. Accordingly, any of these liquids contributes to good bonding when the solder balls are applied to substrates or LSIs.

After the solder balls are applied to LSIs or the like, the LSIs must be flip-chip bonded to a substrate on the counterpart side. This bonding may also preferably be processed by fluxless bonding. In this instance, the liquid used is required to have a good bonding performance (self-alignment), and the alcohols can satisfy this point. Incidentally, the self-alignment refers to the effect of self-correcting any positional deviation by the aid of surface tension produced when the solder melts, even if the positional deviation occurs when solder balls are arranged with registration to carry out bonding with solder balls or apply solder through solder balls.

Accordingly, the alcohols are the best for the liquid that is good for both applying balls to substrates or LSIs and bonding LSIs to substrates (or bonding substrates to substrates).

When selected from among the alcohols, which include various types of liquid, it is necessary to select the melting point of solder and the boiling point of alcohol. Basically, it is necessary to select an alcohol such that the liquid can be present around the solder balls and electrodes at a temperature not lower than the melting point of solder. This is because only any slight deposition of residues of the liquid, which may occur on the electrodes before the solder is wetly spread, prohibits the solder from being wetly spread.

In this regard, liquids having boiling points higher than 2-phenoxyethyl alcohol are preferred, which are shown in FIG. 41.

Figure 42:
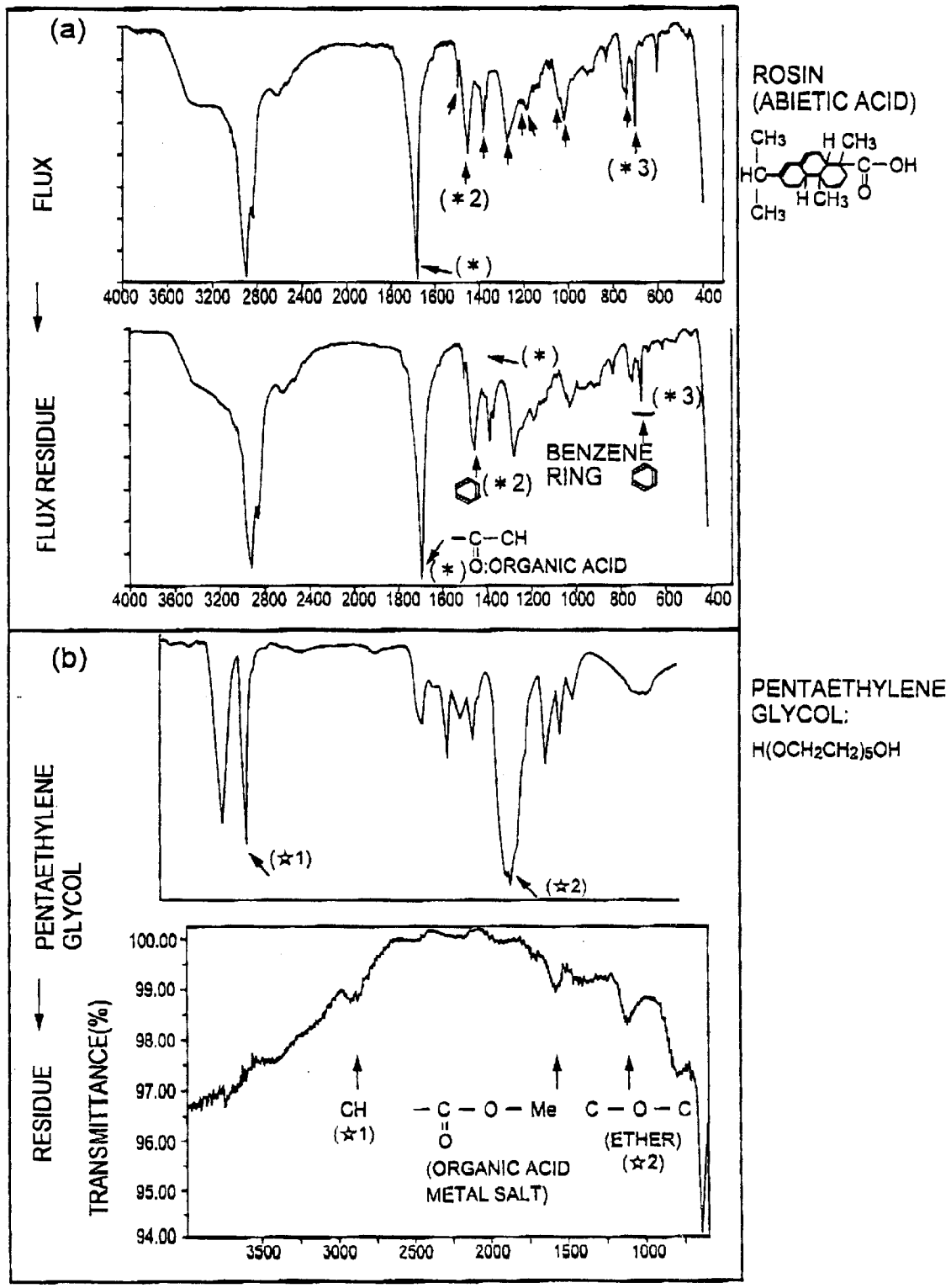
FIG. 42 is a graphic representation showing the results of analysis of residues.

Next, investigation will be made on residues. In FIG. 41, those marked with a circle indicate that the liquid causes very less residues and has no problem in practical use. However, as shown in FIG. 42(b) by FT-IR analysis, an organic metal salt which is a reaction product of an organic acid with a metal is detected, though very slightly, when an alcohol type liquid is used. A migration test made in an environment of high temperature and high humidity has ascertained that this product is in a very small quantity and has no electrical or chemical problem.

FIG. 42(a) shows the results of TF-IR analysis of a flux and flux residues in an instance where a conventional flux is used. As shown in FIG. 42(a), peaks assigned to an organic acid made by abietic acids formed as a result of modification of rosin in the flux and peaks assigned to benzene rings are detected. These organic acids and benzene rings have a high possibility of causing migration. Moreover, in the case of fine bonding as in flip-chip bonding, they have so much a higher possibility of causing the migration that cleaning is required. However, since it is very difficult to clean fine areas, the fluxless bonding of the present invention can be effective.

A summary of the results of investigation shown in FIG. 41 is shown in FIG. 43. As can be seen also from FIG. 43, the alcohols show good results on all the wettability, the self-alignment and the residues. This is because, when the alcohol type liquid is heated, the reaction is presumed to proceed as follows for Sn type solders for example:

(1) As shown by Formula (1), an alcohol, which has an —OH group, undergoes oxidation as a result of the reaction of the —OH group with a surface oxide, and is converted into an aldehyde (—CHO) with a lower boiling point. A part thereof further reacts with the oxide and is converted into an organic acid as shown by Formula (2). This organic acid has a higher boiling point than the original alcohol, and hence remains as a residue if it stands as it is. However, as shown by Formula (3), as a result of decarboxylation to have a lower boiling point, it vaporizes and does not form any residue. Also, as shown by Formula (4), it may form a metal salt in some cases, which slightly remains as a residue.

$$R\text{—}OH + SnO \rightarrow R'\text{—}CHO + Sn\downarrow + H_2O\uparrow \qquad (1)$$

$$R'\text{—}OH + SnO \rightarrow R'\text{—}COOH\downarrow + Sn\downarrow \qquad (2)$$

$$R'\text{—}COOH + SnO \rightarrow R'\text{—}H\uparrow + CO_2\uparrow \qquad (3)$$

$$R'\text{—}COOH + SnO \rightarrow (R'COO)_2Sn\downarrow + H_2O\uparrow \qquad (4)$$

As stated above, the use of the alcohol type liquids as shown in the drawing makes it possible to carry out good solder application and solder bonding without requiring any flux or cleaning step. More specifically, the alcohol type liquid covers the solder ball and electrode surfaces to not only prevent reoxidation but also remove the initial surface oxide films from the solder ball surfaces, and hence enables the solder to be readily wetly spread over the electrode surfaces. It also makes greater the self-alignment effect attributable to the surface tension of the solder.

The above applying and bonding process in the present invention can be used not only in soldering but also any process of applying gold bumps or bonding with gold bumps which are widely used in BGA (ball grid array) and so forth. Use of the liquid as described above enables achievement of better bonding because of the —OH group reducing action to remove organic contaminant films from gold surfaces. The same applies also to bumps other than the gold bumps.

The respective liquids have different vaporization rates depending on surrounding conditions as exemplified by surrounding gases, heating device structure and surrounding pressure. The results shown this time are obtained when, e.g., Sn-3 wt. % Ag solder (melting point: 221° C.) is used and the heating is carried out, e.g., in an atmosphere of $N_2$ or in an atmosphere of He. Differences in such surrounding conditions are considered to result in differences in the quantity of liquid remaining after heat reflowing. Basically, the wettability and self-alignment of solder can be ensured when the alcohol type liquid as shown in the drawing is applied in a quantity necessary only for covering the solder ball surfaces and electrode surfaces at least during the heat-melting. Also, after the bonding, the alcohol type liquid used may remain in the state it returned to room temperature. Such a liquid, however, has a high possibility of causing migration between electrodes, caused by the components composing the solder. Accordingly, it is preferable to remove the liquid by making cooling time longer, making surrounding gas flow rate higher or making surrounding pressure lower to accelerate the vaporization rate. For example, the liquid can be completely removed by making the surrounding pressure lower than 1 atmospheric pressure in the cooling step after the solder has solidified.

As for the processing atmosphere in which the above alcohol type liquid is used, it must be an inert atmosphere or an atmosphere having a low oxidizing action. It may preferably be an atmosphere having an oxygen concentration of 10 ppm or below.

We claim:

1. A process for manufacturing an electronic circuit device by bonding a solder material at least to an electrode mounted on circuit boards or an electrode of electronic parts; said process comprising the steps of:

removing an oxide film or an organic contaminant film existing on surfaces of said electrode and the solder material;

applying said solder material to said electrode;

applying a liquid so as to cover an area to which solder is to be bonded, comprising at least said electrode and said solder material; and heat-melting the solder material, wherein said liquid is a material vaporizing after the bonding between said electrode and said solder material is completed in said heat-melting step, and preventing reoxidation of a surface of the area to which solder is to be bonded; and wherein a resist is provided at an area surrounding said electrode in advance, and is formed in a thickness which is larger than a thickness of said electrode, whereby the solder material is prevented from coming off the surface of the electrode, from the solder material applying step until the bonding is completed in the heat-melting step.

2. A process for manufacturing an electronic circuit device by bonding a solder material at least to an electrode mounted on circuit boards or an electrode of electronic parts; said process comprising the steps of:

removing an oxide film or an organic contaminant film existing on surfaces of said electrode and the solder material;

applying a liquid so as to cover at least an area to which solder is to be applied to said electrode;

applying said solder material to said area to which solder is to be applied; and heat-melting the solder material, wherein said liquid is a material vaporizing after the bonding between said electrode and said solder material is completed in said heat-melting step, and preventing reoxidation of a surface of the area to which solder is to be applied; and wherein a resist is provided at an area surrounding said electrode in advance, and is formed in a thickness which is larger than a thickness of said electrode, whereby the solder material is prevented from coming off the surface of the electrode, from the solder material applying step until the bonding is completed in the heat-melting step.

3. A process for manufacturing an electronic circuit device by bonding a solder material at least to an electrode mounted on circuit boards or an electrode of electronic parts, said process comprising the steps of:

removing an oxide film or an organic contaminant film existing on surfaces of said electrode and the solder material;

applying said solder material to said electrode; and heat-melting the solder material, wherein a resist is provided at an area surrounding said electrode in advance, and is formed in a thickness which is larger than a thickness of said electrode, whereby the solder material is prevented from coming off the surface of the electrode, from the solder material applying step until the bonding is completed in the heat-melting step.

4. A process for manufacturing an electronic circuit device by bonding a solder material at least to an electrode mounted on circuit boards or an electrode of electronic parts, said process comprising the steps of:

removing an oxide film or an organic contaminant film existing on surfaces of said electrode and the solder material;

applying a liquid to said electrode;

applying said solder material to said area to which solder is to be applied to said electrode; and heat-melting the solder material, wherein said liquid is a material vaporizing after the bonding between said electrode and said solder material is completed in said heat-melting step, being applied to every electrode, and provisionally fastening said solder material to said area to which solder is to be bonded, and wherein a resist is provided at an area surrounding said electrode in advance, and is formed in a thickness which is larger than a thickness of said electrode, whereby the solder material is prevented from coming off the surface of the electrode, from the solder material applying step until the bonding is completed in the heat-melting step.

* * * * *